(12) United States Patent
Iwasaki et al.

(10) Patent No.: US 11,815,570 B2
(45) Date of Patent: Nov. 14, 2023

(54) MAGNETIC SENSOR AND DIAGNOSTIC DEVICE

(71) Applicant: KABUSHIKI KAISHA TOSHIBA, Tokyo (JP)

(72) Inventors: Hitoshi Iwasaki, Nerima Tokyo (JP); Akira Kikitsu, Yokohama Kanagawa (JP); Yoshihiro Higashi, Komatsu Ishikawa (JP); Satoshi Shirotori, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 539 days.

(21) Appl. No.: 17/019,652

(22) Filed: Sep. 14, 2020

(65) Prior Publication Data

US 2021/0286026 A1 Sep. 16, 2021

(30) Foreign Application Priority Data

Mar. 11, 2020 (JP) ................................ 2020-042285

(51) Int. Cl.
*G01R 33/09* (2006.01)
(52) U.S. Cl.
CPC ......... *G01R 33/093* (2013.01); *G01R 33/098* (2013.01)
(58) Field of Classification Search
CPC ............................. G01R 33/093; G01R 33/098
See application file for complete search history.

(56) References Cited

U.S. PATENT DOCUMENTS

| 2015/0331072 A1 | 11/2015 | Ogawa et al. |
| 2017/0209062 A1* | 7/2017 | Iwasaki .................. H10N 50/10 |
| 2018/0271395 A1 | 9/2018 | Iwasaki et al. |

FOREIGN PATENT DOCUMENTS

| JP | 2015-219061 A | 12/2015 |
| JP | 2017-133891 A | 8/2017 |
| JP | 2018-155719 A | 10/2018 |
| JP | 2019-074481 A | 5/2019 |
| JP | 2020-042038 A | 3/2020 |

OTHER PUBLICATIONS

Valadeiro et al., "Strategies for pTesla Field Detection Using Magnetoresistive Sensors With a Soft Pinned Sensing Layer," IEEE Transactions on Magnetics (Jan. 2015), vol. 51, No. 1, 4400204 (4 pages).

* cited by examiner

*Primary Examiner* — Minh Q Phan
(74) *Attorney, Agent, or Firm* — Finnegan, Henderson, Farabow, Garrett & Dunner, LLP

(57) ABSTRACT

According to one embodiment, a magnetic sensor includes a first magnetic part, a first magnetic member, a second magnetic part, a second magnetic member, a first element, a second element, a third element, a fourth element, and a first interconnect. The first magnetic part includes first, second, and third portions. The first portion is between the second and third portions. The second magnetic part includes fourth, fifth, and sixth portions. The fourth portion is between the fifth and sixth portions. The first element includes a first magnetic layer. The second element includes a second magnetic layer. The third element includes a third magnetic layer. The fourth element includes a fourth magnetic layer. The first interconnect includes first and second interconnect portions.

18 Claims, 13 Drawing Sheets

MAGNETIC SENSOR AND DIAGNOSTIC DEVICE

CROSS-REFERENCE TO RELATED APPLICATIONS

This application is based upon and claims the benefit of priority from Japanese Patent Application No. 2020-042285, filed on Mar. 11, 2020; the entire contents of which are incorporated herein by reference.

FIELD

Embodiments of the invention generally relate to a magnetic sensor and a diagnostic device.

BACKGROUND

There is a magnetic sensor that uses a magnetic layer. There is a diagnostic device that uses a magnetic sensor. It is desirable to increase the sensitivity of the magnetic sensor.

DETAILED DESCRIPTION

Figure 1A:
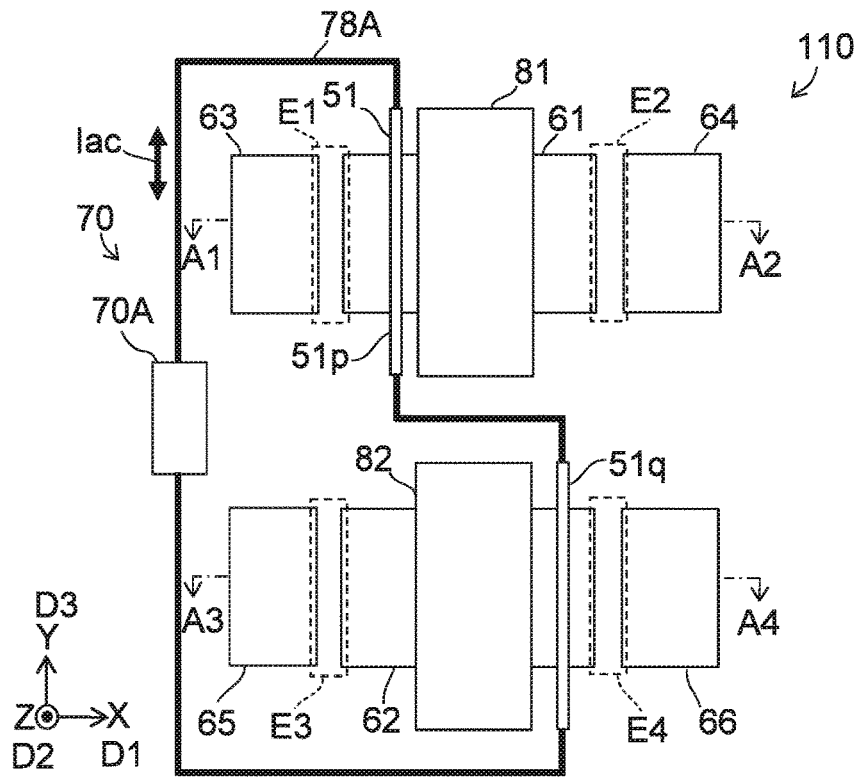
FIGS. 1A to 1C are schematic views illustrating a magnetic sensor according to a first embodiment.

According to one embodiment, a magnetic sensor includes a first magnetic part, a first magnetic member, a second magnetic part, a second magnetic member, a first element, a second element, a third element, a fourth element, and a first interconnect. The first magnetic part includes a first portion, a second portion, and a third portion. A direction from the second portion toward the third portion is along a first direction. The first portion is between the second portion and the third portion in the first direction. A second direction from the first portion toward the first magnetic member crosses the first direction. The second magnetic part includes a fourth portion, a fifth portion, and a sixth portion. A direction from the fifth portion toward the sixth portion is along the first direction. The fourth portion is between the fifth portion and the sixth portion in the first direction. A direction from the fourth portion toward the second magnetic member is along the second direction. The first element includes a first magnetic layer. A distance between the first element and the second portion is less than a distance between the first element and the first portion. The second element includes a second magnetic layer. A distance between the second element and the third portion is less than a distance between the second element and the first portion. The third element includes a third magnetic layer. A distance between the third element and the fifth portion is less than a distance between the third element and the fourth portion. The fourth element includes a fourth magnetic layer. A distance between the fourth element and the sixth portion is less than a distance between the fourth element and the fourth portion. The first interconnect includes a first interconnect portion and a second interconnect portion. An orientation from the first interconnect portion toward the first magnetic member includes a reverse component of an orientation from the second interconnect portion toward the second magnetic member.

According to one embodiment, a diagnostic device includes the magnetic sensor described above, and a processor processing an output signal obtained from the magnetic sensor.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

Figure 1B:
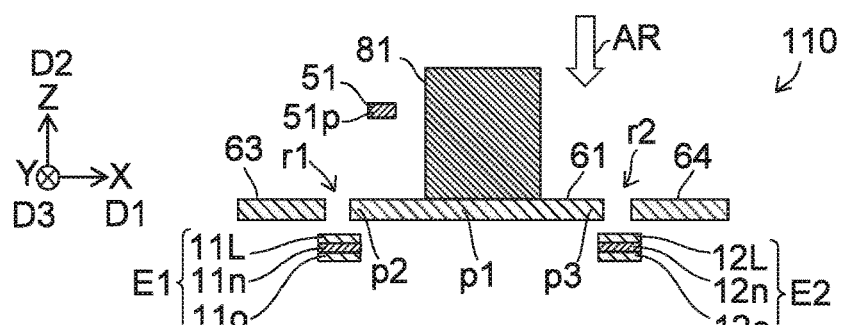
Figure 1C:
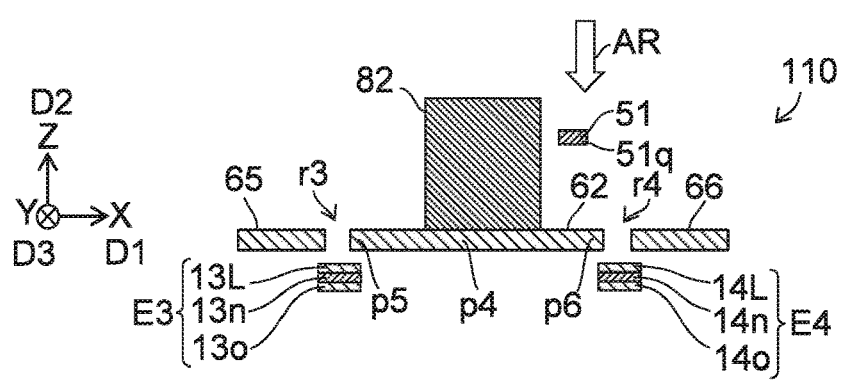

FIGS. 1A to 1C are schematic views illustrating a magnetic sensor according to a first embodiment. FIG. 1A is a plan view as viewed along arrow AR of FIGS. 1B and 1C. FIG. 1B is a line A1-A2 cross-sectional view of FIG. 1A. FIG. 1C is a line A3-A4 cross-sectional view of FIG. 1A.

As shown in FIGS. 1A to 1C, the magnetic sensor 110 according to the embodiment includes a first magnetic part 61, a first magnetic member 81, a second magnetic part 62, a second magnetic member 82, a first element E1, a second element E2, a third element E3, and a fourth element E4.

In the example, the magnetic sensor 110 further includes a third magnetic part 63, a fourth magnetic part 64, a fifth magnetic part 65, and a sixth magnetic part 66. These magnetic parts are described below.

As shown in FIG. 1B, the first magnetic part 61 includes a first portion p1, a second portion p2, and a third portion p3. The direction from the second portion p2 toward the third portion p3 is along a first direction D1. The first portion p1 is between the second portion p2 and the third portion p3 in the first direction D1. For example, the second portion p2 and the third portion p3 correspond to two end portions of the first magnetic part 61.

The first direction D1 is taken as an X-axis direction. A direction perpendicular to the X-axis direction is taken as a Z-axis direction. A direction perpendicular to the X-axis direction and the Z-axis direction is taken as a Y-axis direction.

As shown in FIG. 1B, a second direction D2 from the first portion p1 toward the first magnetic member 81 crosses the first direction D1. The second direction D2 is, for example, the Z-axis direction.

As shown in FIG. 1C, the second magnetic part 62 includes a fourth portion p4, a fifth portion p5, and a sixth portion p6. The direction from the fifth portion p5 toward the sixth portion p6 is along the first direction D1. The fourth portion p4 is between the fifth portion p5 and the sixth portion p6 in the first direction D1. For example, the fifth portion p5 and the sixth portion p6 correspond to two end portions of the second magnetic part 62.

As shown in FIG. 1C, the direction from the fourth portion p4 toward the second magnetic member 82 is along the second direction D2.

In the example, the direction from the second magnetic part 62 toward the first magnetic part 61 is along a third direction D3. The third direction D3 crosses a plane including the first direction D1 and the second direction D2. The third direction D3 is, for example, the Y-axis direction. In the example, the direction from the first magnetic member 81 toward the second magnetic member 82 is along the third direction D3 (e.g., the Y-axis direction).

As shown in FIG. 1B, the first element E1 includes a first magnetic layer 11L. In the example, the first element E1 includes a first counter magnetic layer 11o and a first nonmagnetic layer 11n. The first nonmagnetic layer 11n is between the first counter magnetic layer 11o and the first magnetic layer 11L.

As shown in FIG. 1B, the second element E2 includes a second magnetic layer 12L. In the example, the second element E2 includes a second counter magnetic layer 12o and a second nonmagnetic layer 12n. The second nonmagnetic layer 12n is between the second counter magnetic layer 12o and the second magnetic layer 12L.

As shown in FIG. 1C, the third element E3 includes a third magnetic layer 13L. In the example, the third element E3 includes a third counter magnetic layer 13o and a third nonmagnetic layer 13n. The third nonmagnetic layer 13n is between the third counter magnetic layer 13o and the third magnetic layer 13L.

As shown in FIG. 1C, the fourth element E4 includes a fourth magnetic layer 14L. In the example, the fourth element E4 includes a fourth counter magnetic layer 14o and a fourth nonmagnetic layer 14n. The fourth nonmagnetic layer 14n is between the fourth counter magnetic layer 14o and the fourth magnetic layer 14L.

As shown in FIG. 1B, the distance between the first element E1 and the second portion p2 is less than the distance between the first element E1 and the first portion p1. As shown in FIG. 1B, the distance between the second element E2 and the third portion p3 is less than the distance between the second element E2 and the first portion p1. For example, the first element E1 is proximate to the second portion p2. The second element E2 is proximate to the third portion p3.

As shown in FIG. 1C, the distance between the third element E3 and the fifth portion p5 is less than the distance between the third element E3 and the fourth portion p4. As shown in FIG. 1C, the distance between the fourth element E4 and the sixth portion p6 is less than the distance between the fourth element E4 and the fourth portion p4. For example, the third element E3 is proximate to the fifth portion p5. The fourth element E4 is proximate to the sixth portion p6.

For example, an external magnetic field that is to be detected is applied to the first magnetic member 81 and the second magnetic member 82. For example, a portion of the external magnetic field passes through the first magnetic member 81 in the Z-direction, passes through the first magnetic part 61, and is applied to the first and second elements E1 and E2. The external magnetic field is applied to the first element E1 along the −X direction. The external magnetic field is applied to the second element E2 along the +X direction (the reverse direction of the first element E1). Similarly, for example, another portion of the external magnetic field passes through the second magnetic member 82 in the Z-direction, passes through the second magnetic part 62, and enters the third element E3 and the fourth element E4. The external magnetic field is applied to the third element E3 along the −X direction. The external magnetic field is applied to the fourth element E4 along the +X direction (the reverse direction of the third element E3). For example, the first magnetic member 81 and the second magnetic member 82 function as MFCs (Magnetic Field Concentrators).

For example, the external magnetic field that passes through the first magnetic member 81 and the second magnetic member 82 has a Z-axis direction component. For example, the magnetic field that passes through the first magnetic member 81 and the second magnetic member 82 becomes a magnetic field that has X-axis direction components in the first magnetic part 61 and the second magnetic part 62. The magnetic field enters the first to fourth elements E1 to E4.

When the magnetic field is applied to the first to fourth elements E1 to E4, the angles between the magnetizations of the magnetic layers and the magnetizations of the counter magnetic layers change. The electrical resistances of these elements change according to the intensity of the magnetic field. For example, the changes of the electrical resistances are based on a magnetoresistance effect. These elements are, for example, GMR (Giant Magneto Resistive effect) elements. These elements may be, for example, TMR (Tunneling Magnetoresistance effect) elements.

In the embodiment, a first interconnect 51 includes a first interconnect portion 51p and a second interconnect portion 51q. The first interconnect portion 51p and the second interconnect portion 51q are along the third direction D3 (e.g., the Y-axis direction).

The orientation from the first interconnect portion 51p toward the first magnetic member 81 includes a reverse component of the orientation from the second interconnect portion 51q toward the second magnetic member 82. For example, the orientation from the first interconnect portion 51p toward the first magnetic member 81 includes a first direction D1 component (e.g., a component in the +X orientation). For example, the orientation from the second interconnect portion 51q toward the second magnetic member 82 includes a component along the first direction D1 (a component in the −X orientation).

In the example, the orientation from the first interconnect portion 51p toward the first magnetic member 81 is the rightward orientation in FIG. 1A. In the example, the orientation from the second interconnect portion 51q toward the second magnetic member 82 is the leftward orientation in FIG. 1A. For example, the positional relationship between the first interconnect portion 51p and the first magnetic member 81 is the reverse of the positional relationship between the second interconnect portion 51q and the second magnetic member 82.

When a current flows in the first interconnect 51, a current magnetic field that is due to the current is applied to the first magnetic member 81 and the second magnetic member 82 along the Z-direction. As described above, the positional relationship between the first interconnect portion 51p and the first magnetic member 81 is the reverse of the positional relationship between the second interconnect portion 51q and the second magnetic member 82. Therefore, the orientation of the current magnetic field in the first magnetic member 81 is the reverse of the orientation of the current magnetic field in the second magnetic member 82. The orientation of the current flowing in the first interconnect portion 51p is the same as the orientation of the current flowing in the second interconnect portion 51q.

In the embodiment, two magnetic parts (e.g., the first magnetic part 61 and the second magnetic part 62) and two magnetic members (e.g., the first magnetic member 81 and the second magnetic member 82) are provided. The positional relationship with the first interconnect 51 is reversed between the two magnetic members. By such a configuration, the orientation of the current magnetic field in the first magnetic member 81 and the orientation of the current magnetic field in the second magnetic member 82 are mutually reversed. For example, when a −X direction current magnetic field is applied to the first element E1 and a +X direction current magnetic field is applied to the second element E2 via the first magnetic part 61, a +X direction current magnetic field is applied to the third element E3 and a −X direction current magnetic field is applied to the fourth element E4 via the second magnetic part 62. For example, when a +X direction current magnetic field is applied to the first element E1 and a −X direction current magnetic field is applied to the second element E2 via the first magnetic part 61, a −X direction current magnetic field is applied to the third element E3 and a +X direction current magnetic field is applied to the fourth element E4 via the second magnetic part 62. As a result, when an external magnetic field is applied to the first magnetic member 81 and the second magnetic member 82 along the Z-direction (the same direction, which is unlike the current magnetic fields), for the combined magnetic field of the detected magnetic field and the current magnetic fields, the resistance changes of the third and fourth elements E3 and E4 decrease in the case where the resistances of the first and second elements E1 and E2 increase. On the other hand, the resistance changes of the third and fourth elements E3 and E4 increase in the case where the resistances of the first and second elements E1 and E2 decrease. As a result, a differential voltage that has the frequency of the alternating current of the interconnect 51 is generated between the middle of an interconnect conducting from the first element E1 toward the fourth element E4 and the middle of an interconnect conducting from the third element E3 toward the second element E2. The voltage is detected by a detection circuit 70D (referring to FIG. 2). When the external magnetic field is zero and only the current magnetic fields are applied to the first to fourth elements E1 to E4, the differential voltage between the middle points becomes zero; a differential voltage is linearly generated according to the external magnetic field. By providing the first to fourth elements E1 to E4 at the end portions of such a first magnetic part 61 and such a second magnetic part 62 and by processing the signal obtained from these elements, the effects of noise can be suppressed, and the external magnetic field can be detected with high sensitivity. According to the embodiment, a magnetic sensor can be provided in which the sensitivity can be increased. Examples of the magnetic fields described above are described below.

In the example as shown in FIGS. 1A to 1C, the magnetic sensor 110 further includes the third magnetic part 63, the fourth magnetic part 64, the fifth magnetic part 65, and the sixth magnetic part 66. The first magnetic part 61 is between the third magnetic part 63 and the fourth magnetic part 64 in the first direction D1. The second magnetic part 62 is between the fifth magnetic part 65 and the sixth magnetic part 66 in the first direction D1.

As shown in FIG. 1B, the direction from the first element E1 toward a region r1 between the third magnetic part 63 and the first magnetic part 61 is along the second direction D2. The direction from the second element E2 toward a region r2 between the first magnetic part 61 and the fourth magnetic part 64 is along the second direction D2. As shown in FIG. 1C, the direction from the third element E3 toward a region r3 between the fifth magnetic part 65 and the second magnetic part 62 is along the second direction D2. The direction from the fourth element E4 toward a region r4 between the second magnetic part 62 and the sixth magnetic part 66 is along the second direction D2.

By such first to sixth magnetic parts 61 to 66, the external magnetic field can be more effectively concentrated in the first to fourth elements E1 to E4. The sensitivity can be further increased.

As shown in FIG. 1A, the magnetic sensor 110 may include a circuit part 70. The circuit part 70 includes an alternating current circuit 70A. The alternating current circuit 70A is configured to supply an alternating current Iac to the first interconnect 51. For example, an interconnect 78A that electrically connects the alternating current circuit 70A and the first interconnect 51 is provided.

As described below, the detection signal that is obtained from the first to fourth elements E1 to E4 is modulated by the alternating current Iac supplied from the alternating current circuit 70A. By processing such a detection signal, detection with higher sensitivity is possible. Examples of modulation by the alternating current Iac are described below.

Figure 2:
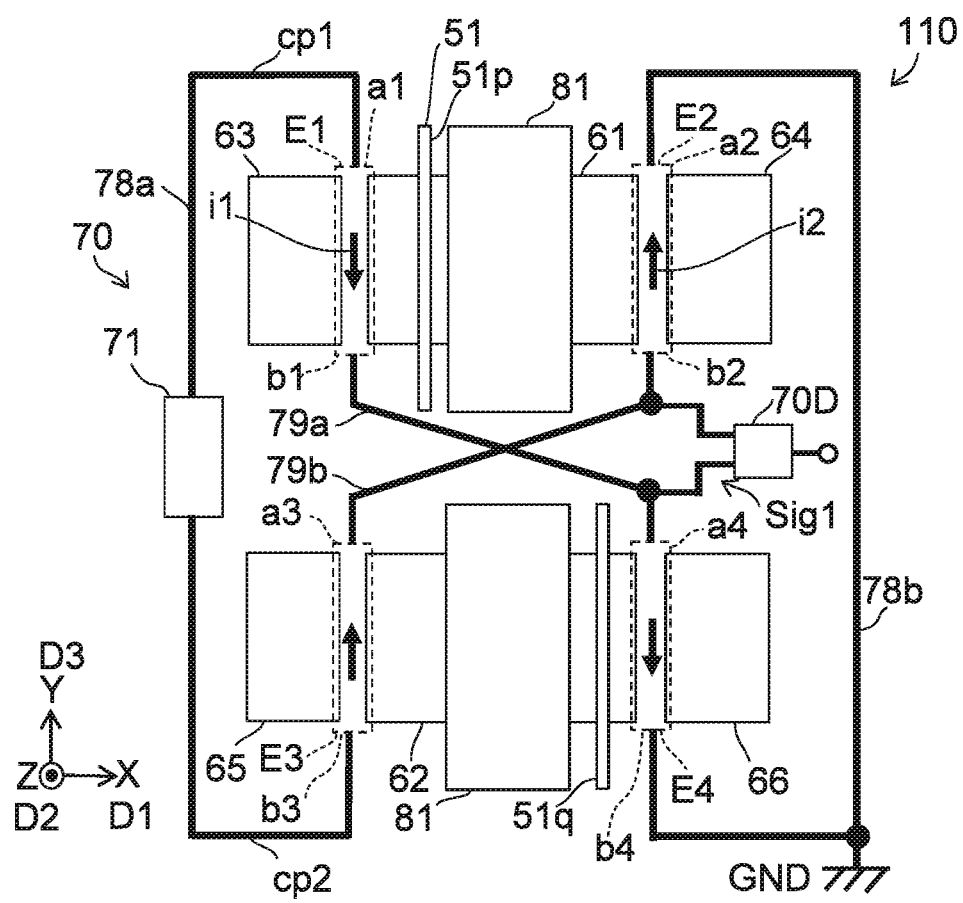
FIG. 2 is a schematic plan view illustrating the magnetic sensor according to the first embodiment.

FIG. 2 is a schematic plan view illustrating the magnetic sensor according to the first embodiment.

FIG. 2 shows an example of the electrical connections of the first to fourth elements E1 to E4.

As shown in FIG. 2, the magnetic sensor 110 may include a first connector 79a and a second connector 79b. The first connector 79a electrically connects the first element E1 and the fourth element E4. The second connector 79b electrically connects the second element E2 and the third element E3.

As shown in FIG. 2, the magnetic sensor 110 may include a first circuit 71. The first circuit 71 may be included in the circuit part 70.

For example, the first element E1 includes a first element end portion a1 and a first element other-end portion b1. The second element E2 includes a second element end portion a2 and a second element other-end portion b2. The third element E3 includes a third element end portion a3 and a third element other-end portion b3. The fourth element E4 includes a fourth element end portion a4 and a fourth element other-end portion b4.

For example, the first connector 79a electrically connects the first element other-end portion b1 and the fourth element end portion a4. The second connector 79b electrically connects the second element other-end portion b2 and the third element end portion a3. For example, the first element end portion a1 and the third element other-end portion b3 are electrically connected to the first circuit 71. For example, the connection is performed by an interconnect 78a. For example, the second element end portion a2 and the fourth element other-end portion b4 are electrically connected to a ground GND. For example, the connection is performed by an interconnect 78b. A bridge circuit is formed by such a configuration.

For example, the bridge circuit of the magnetic sensor 110 includes, for example, a first path cp1 and a second path cp2. The first path cp1 includes the first element E1, the first connector 79a, and the fourth element E4. The second path cp2 includes the second element E2, the second connector 79b, and the third element E3.

The first circuit 71 is configured to supply a first current i1 to the first path cp1. The first circuit 71 is configured to supply a second current i2 to the second path cp2.

As shown in FIG. 2, the orientation of the first current i1 in the first element E1 includes a reverse component of the orientation of the second current i2 in the second element E2. The orientation of the second current i2 in the third element E3 includes a reverse component of the orientation of the first current i1 in the fourth element E4. As a result, as described above, the potential difference between the middle of the interconnect conducting from the first element E1 toward the fourth element E4 and the middle of the interconnect conducting from the third element E3 toward the second element E2 can be detected by the detection circuit 70D (referring to FIG. 2). By using such a bridge circuit, the effects such as noise, etc., can be further suppressed.

As shown in FIG. 2, the magnetic sensor 110 may include the detection circuit 70D. The detection circuit 70D may be included in the circuit part 70. The detection circuit 70D is configured to detect a signal Sig1 generated between the first connector 79a and the second connector 79b. For example, the detection circuit 70D is configured to output a signal corresponding to the potential (the signal Sig1) of the middle point of the bridge circuit.

Figure 3A:
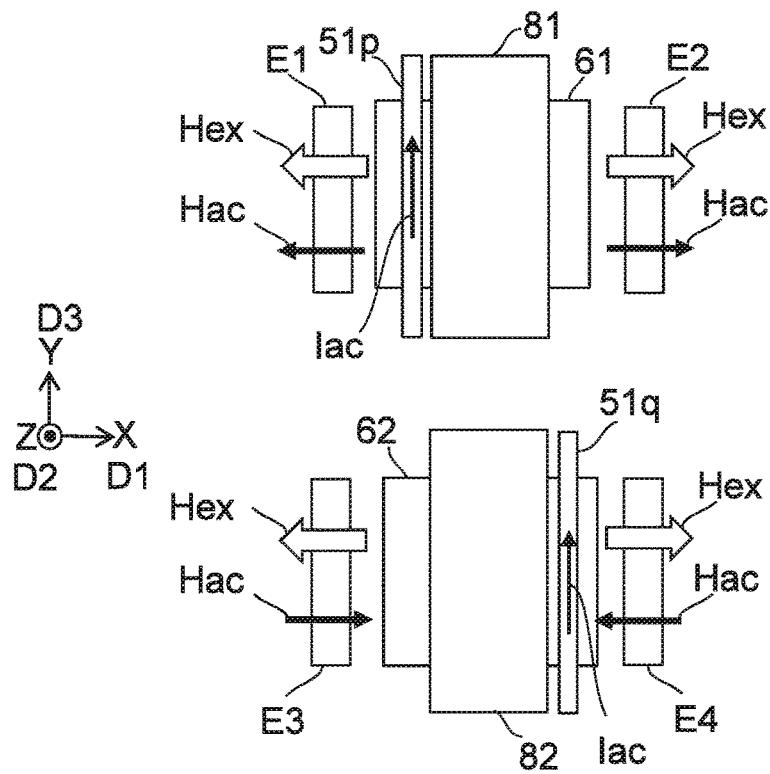
FIGS. 3A to 3C are schematic views illustrating an operation of the magnetic sensor according to the first embodiment.
Figure 3B:
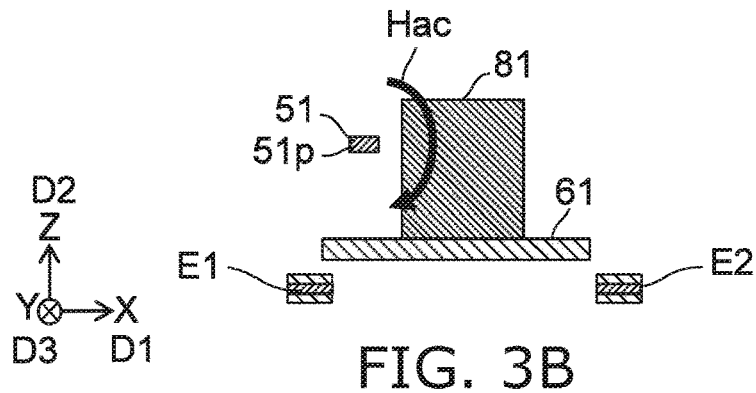
Figure 3C:
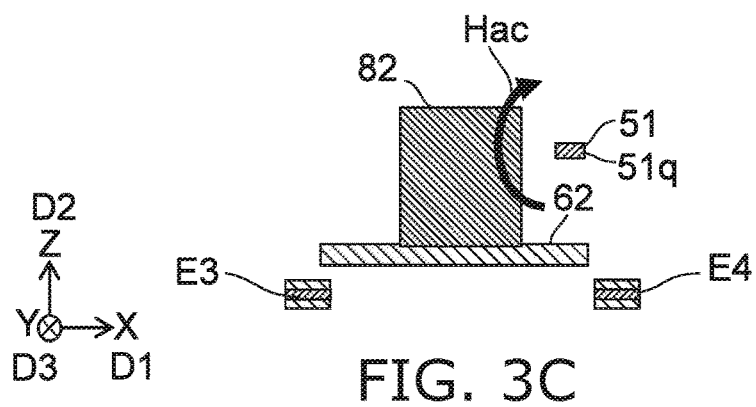

FIGS. 3A to 3C are schematic views illustrating an operation of the magnetic sensor according to the first embodiment.

FIG. 3A is a plan view. FIGS. 3B and 3C are cross-sectional views. As shown in FIGS. 3A to 3C, when an external magnetic field Hex is applied to the first magnetic member 81 and the second magnetic member 82, the external magnetic field Hex is applied to the first to fourth elements E1 to E4 via the first magnetic member 81, the second magnetic member 82, the first magnetic part 61, and the second magnetic part 62. The orientation of the external magnetic field Hex is the same at these elements.

On the other hand, the alternating current Iac is supplied to the first interconnect 51. For example, the alternating current Iac is supplied from the alternating current circuit 70A. An alternating current magnetic field Hac (a current magnetic field) is generated based on the alternating current Iac. FIGS. 3A to 3C illustrate the orientations of the alternating current Iac at one time.

For example, at one time as shown in FIGS. 3A to 3C, the orientation of the alternating current magnetic field Hac applied to the first and second elements E1 and E2 is from the first magnetic member 81 toward the left and right in the drawing. At the one time, the orientation of the alternating current magnetic field Hac applied to the third and fourth elements E3 and E4 is toward the second magnetic member 82 from the left and right in the drawing.

Thus, in the embodiment, an asymmetric alternating current magnetic field Hac is applied to the first to fourth elements E1 to E4. The noise can be further suppressed by connecting such first to fourth elements E1 to E4 in a bridge connection.

An example of characteristics of the first to fourth elements E1 to E4 will now be described.

Figure 4:
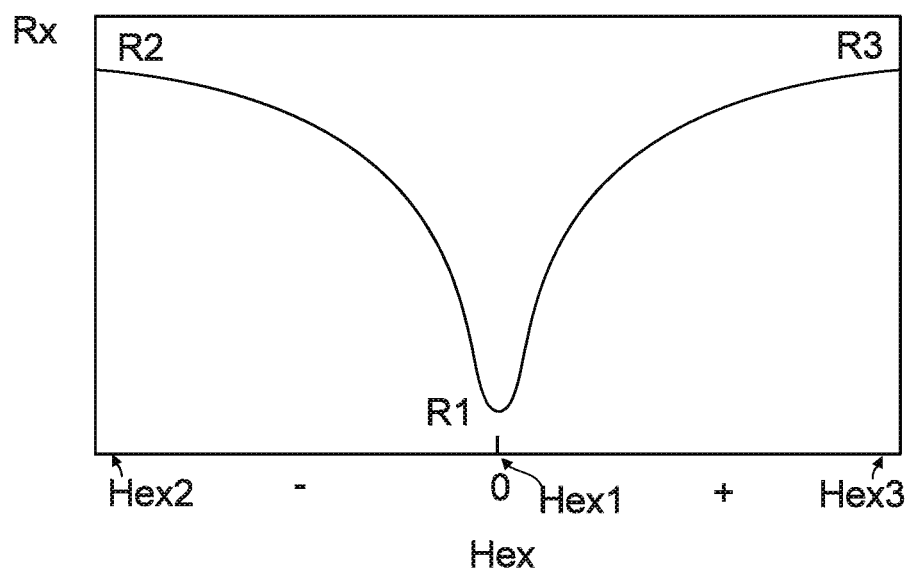
FIG. 4 is a graph illustrating a characteristic of the magnetic sensor according to the first embodiment.

FIG. 4 is a graph illustrating a characteristic of the magnetic sensor according to the first embodiment.

The horizontal axis of FIG. 4 is the intensity of the external magnetic field Hex applied to the first element E1. The vertical axis is an electrical resistance Rx of the first element E1.

As shown in FIG. 4, the electrical resistance Rx has an even-function characteristic with respect to the magnetic field (the external magnetic field Hex) applied to the first element E1.

For example, the electrical resistance Rx has a first value R1 when a first magnetic field Hex1 is applied to the first element E1. The electrical resistance Rx has a second value R2 when a second magnetic field Hex2 is applied to the first element E1. The electrical resistance Rx has a third value R3 when a third magnetic field Hex3 is applied to the first element E1. The absolute value of the first magnetic field Hex1 is less than the absolute value of the second magnetic field Hex2 and less than the absolute value of the third magnetic field Hex3. For example, the first magnetic field Hex1 is substantially 0. The orientation of the second magnetic field Hex2 is the reverse of the orientation of the third magnetic field Hex3. The first value R1 is less than the second value R2 and less than the third value R3. The second to fourth elements E2 to E4 also have characteristics (e.g., even functions) similar to that of the first element E1.

An example of the change of the electrical resistance Rx when the alternating current Iac is supplied to the first interconnect 51 and the alternating current magnetic field Hac due to the alternating current Iac is applied to the first element E1 will now be described.

Figure 5A:
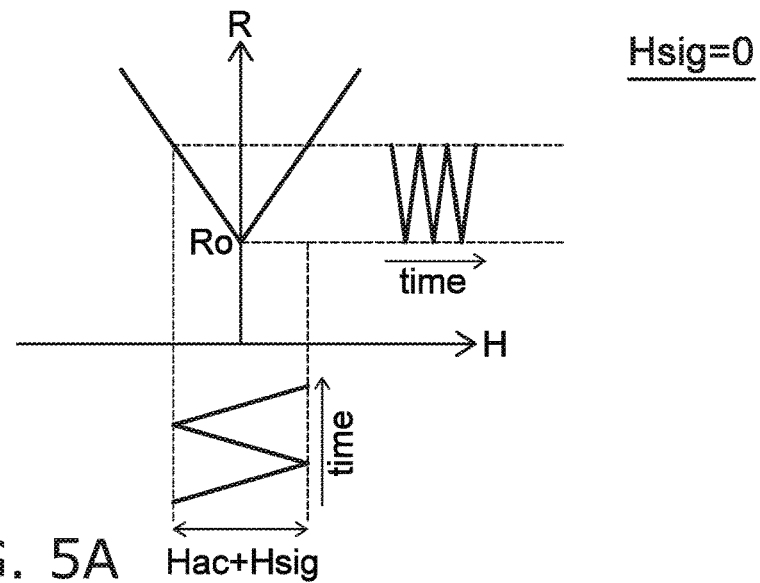
FIGS. 5A to 5C are graphs illustrating the characteristics of the magnetic sensor according to the first embodiment.
Figure 5B:
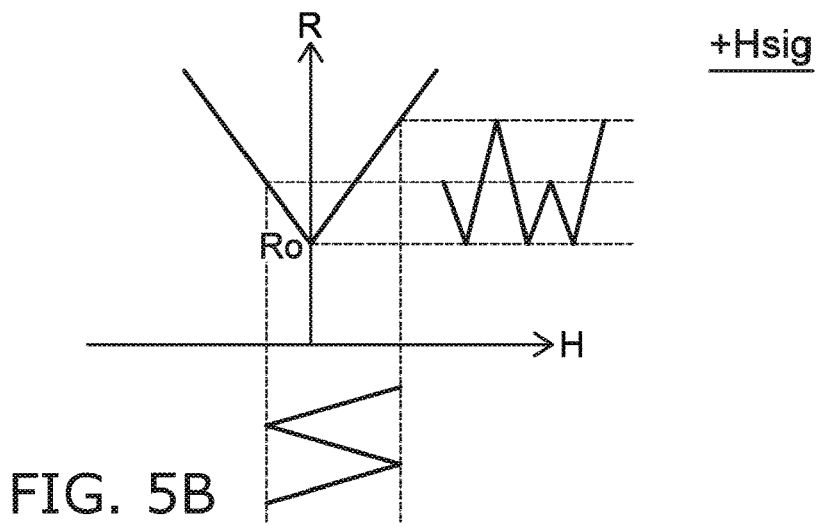
Figure 5C:
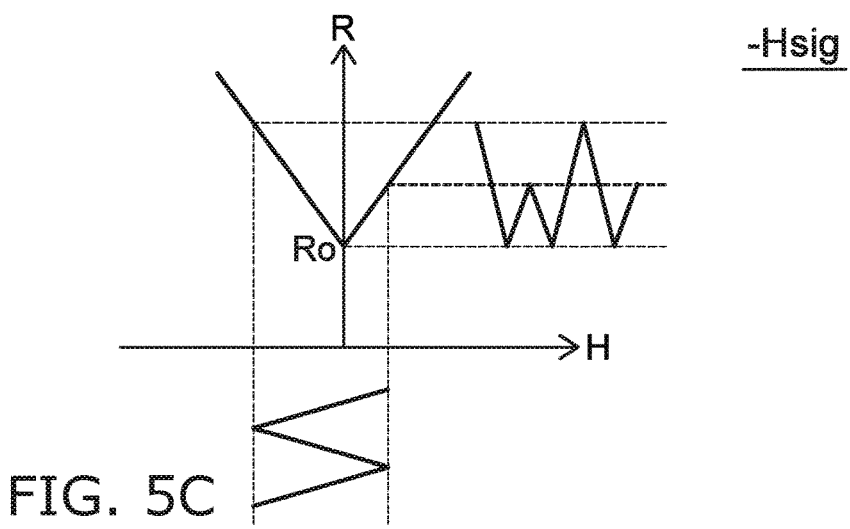

FIGS. 5A to 5C are graphs illustrating the characteristics of the magnetic sensor according to the first embodiment.

FIG. 5A shows characteristics when a signal magnetic field Hsig (the external magnetic field) that is applied to the first element E1 is 0. FIG. 5B shows characteristics when the signal magnetic field Hsig is positive. FIG. 5C shows characteristics when the signal magnetic field Hsig is negative. These figures show the relationship between a magnetic field H and a resistance R (corresponding to the electrical resistance Rx).

As shown in FIG. 5A, when the signal magnetic field Hsig is 0, the resistance R has a characteristic that is symmetric with respect to the positive and negative magnetic field H. When the alternating current magnetic field Hac is zero, the resistance R is a low resistance Ro. The magnetization of the first counter magnetic layer 110 (e.g., a free layer) rotates substantially identically to the positive and negative magnetic field H. Therefore, a symmetric resistance change characteristic is obtained. The fluctuation of the resistance R with respect to the alternating current magnetic field Hac has the same value between the positive and negative polarities. The period of the change of the resistance R is 2 times the period of the alternating current magnetic field Hac. The change of the resistance R substantially does not include the frequency component of the alternating current magnetic field Hac.

As shown in FIG. 5B, the characteristic of the resistance R shifts to the positive magnetic field H side when a positive signal magnetic field Hsig is applied. The resistance R becomes large for the alternating current magnetic field Hac on the positive side. The resistance R becomes small for the alternating current magnetic field Hac on the negative side.

As shown in FIG. 5C, the characteristic of the resistance R shifts to the negative magnetic field H side when a negative signal magnetic field Hsig is applied. The resistance R becomes small for the alternating current magnetic field Hac on the positive side. The resistance R becomes large for the alternating current magnetic field Hac on the negative side.

Resistances R that have mutually-different fluctuation occur for the positive and negative alternating current magnetic field Hac when a signal magnetic field Hsig of a prescribed magnitude is applied. The period of the fluctuation of the resistance R with respect to the positive and negative alternating current magnetic field Hac is equal to the period of the alternating current magnetic field Hac. An output voltage that has an alternating current frequency component corresponding to the signal magnetic field Hsig is generated.

The characteristics described above are obtained in the case where the signal magnetic field Hsig does not temporally change. The case where the signal magnetic field Hsig temporally changes is as follows. The frequency of the signal magnetic field Hsig is taken as a signal frequency fsig. The frequency of the alternating current magnetic field Hac is taken as an alternating current frequency fac. In such a case, an output that corresponds to the signal magnetic field Hsig at frequencies of fac±fsig is generated.

In the case where the signal magnetic field Hsig temporally changes, the signal frequency fsig is, for example, 1 kHz or less. On the other hand, the alternating current frequency fac is sufficiently greater than the signal frequency fsig. For example, the alternating current frequency fac is not less than 10 times the signal frequency fsig.

For example, there is an application in which the magnetic field generated from a living body is detected using the magnetic sensor 110. When detecting such a biological magnetic field (e.g., neuromagnetism, cardiomagnetism, a neuron, etc.), the signal frequency fsig is not less than 1 Hz and not more than 1 kHz. In such a case, the alternating current frequency fac is, for example, 10 kHz or more. It is favorable for the alternating current frequency fac to be high, i.e., 10 kHz or more.

Characteristics similar to the characteristics described with reference to FIGS. 5A to 5C occur in the second to fourth elements E2 to E4 as well.

In the magnetic sensor 110 according to the embodiment, the external magnetic field Hex (the signal magnetic field Hsig) which is the detection object can be detected with high sensitivity by using such characteristics.

For example, a bridge circuit is formed of the first to fourth elements E1 to E4, and the detection circuit 70D is configured to output a signal that corresponds to the potential (the signal Sig1) of the middle point of the bridge circuit. For example, the detection circuit 70D is configured to detect the intensity of the frequency component of the alternating current Iac included in the signal Sig1. For example, FFT (Fast Fourier Transform) processing, etc., are performed. The external magnetic field Hex to be detected can be detected with high sensitivity by detecting the intensity of the frequency component of ½ of the frequency of the alternating current Iac from the spectrum obtained by such processing.

Figure 6A:
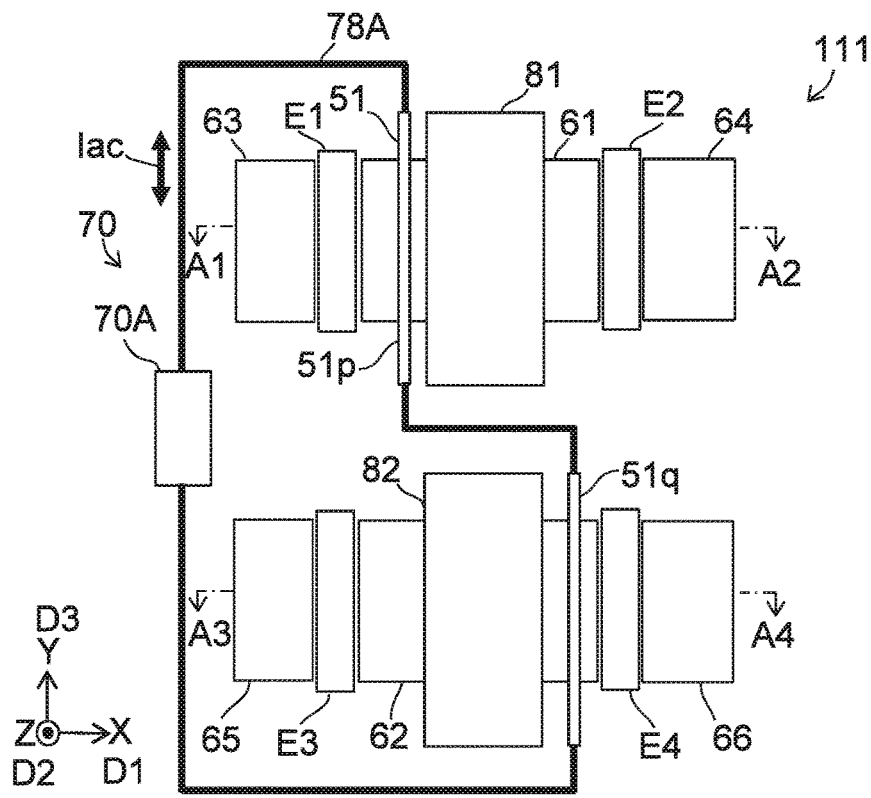
FIGS. 6A to 6C are schematic views illustrating a magnetic sensor according to the first embodiment.
Figure 6B:
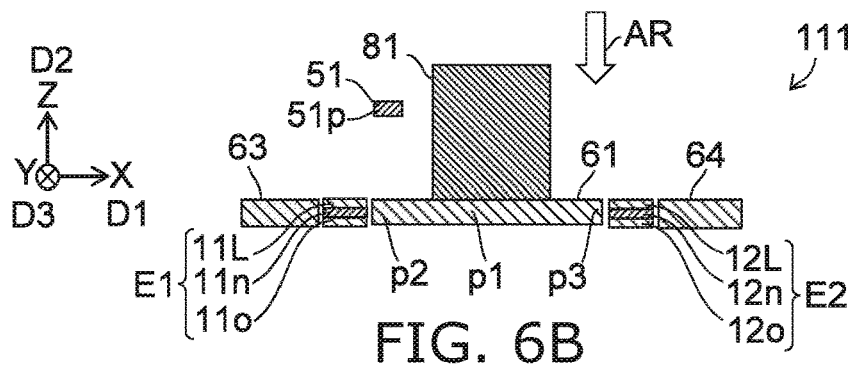
Figure 6C:
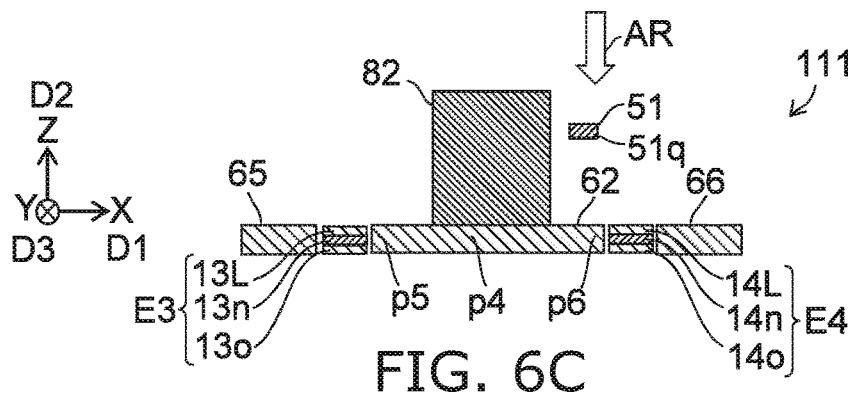

FIGS. 6A to 6C are schematic views illustrating a magnetic sensor according to the first embodiment. FIG. 6A is a plan view as viewed along arrow AR of FIGS. 6B and 6C. FIG. 6B is a line A1-A2 cross-sectional view of FIG. 6A. FIG. 6C is a line A3-A4 cross-sectional view of FIG. 6A.

As shown in FIGS. 6A to 6C, the magnetic sensor 111 according to the embodiment also includes the first to sixth magnetic parts 61 to 66, the first magnetic member 81, the second magnetic member 82, and the first to fourth elements E1 to E4. The positions of the first to fourth elements E1 to E4 of the magnetic sensor 111 are different from those of the magnetic sensor 110. Otherwise, the configuration of the magnetic sensor 111 may be similar to that of the magnetic sensor 110.

As shown in FIGS. 6A and 6B, the first magnetic part 61 is between the third magnetic part 63 and the fourth magnetic part 64 in the first direction D1. As shown in FIGS. 6A and 6C, the second magnetic part 62 is between the fifth magnetic part 65 and the sixth magnetic part 66 in the first direction D1. As shown in FIG. 6B, at least a portion of the first element E1 is between the third magnetic part 63 and the first magnetic part 61 in the first direction D1. At least a portion of the second element E2 is between the first magnetic part 61 and the fourth magnetic part 64 in the first direction D1. As shown in FIG. 6C, at least a portion of the third element E3 is between the fifth magnetic part 65 and the second magnetic part 62 in the first direction D1. At least a portion of the fourth element E4 is between the second magnetic part 62 and the sixth magnetic part 66 in the first direction D1. In the magnetic sensor 111 as well, a magnetic sensor can be provided in which the sensitivity can be increased.

Figure 7A:
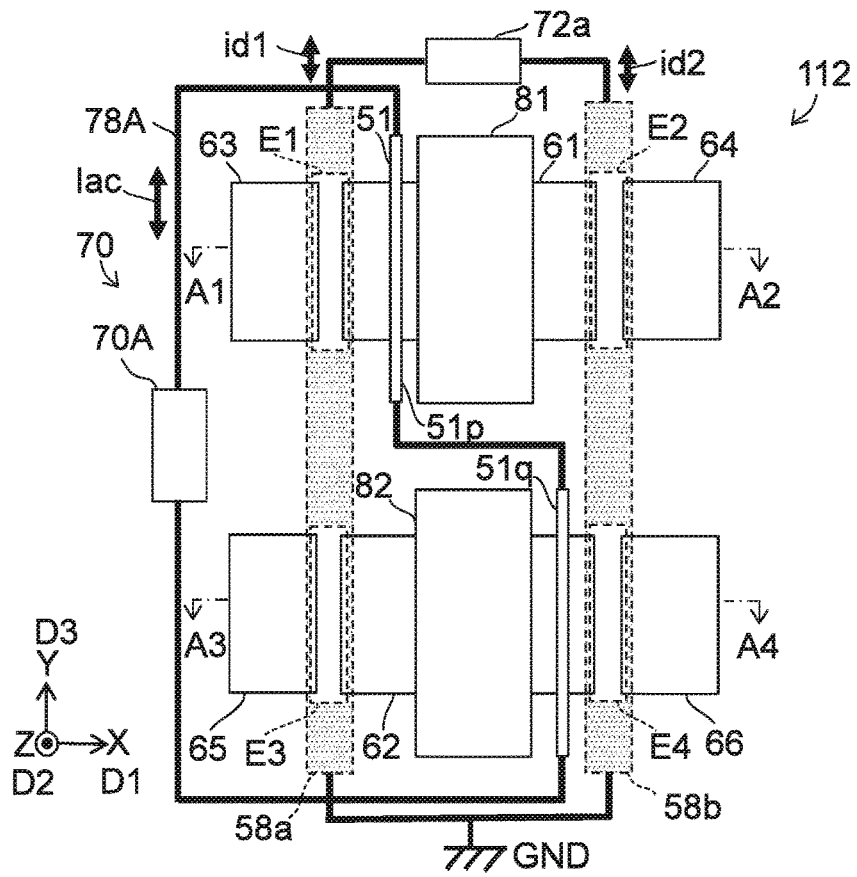
FIGS. 7A to 7C are schematic views illustrating a magnetic sensor according to the first embodiment.
Figure 7B:
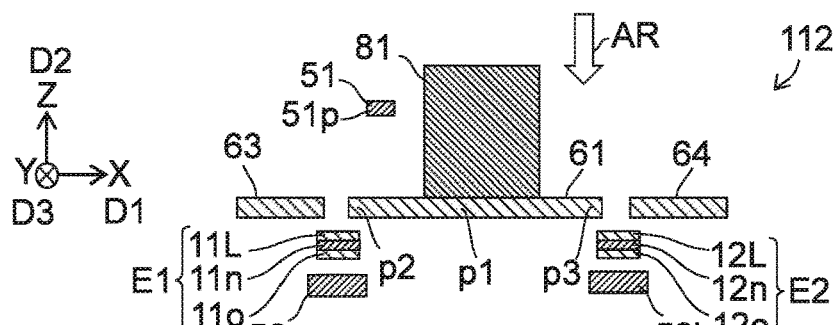
Figure 7C:
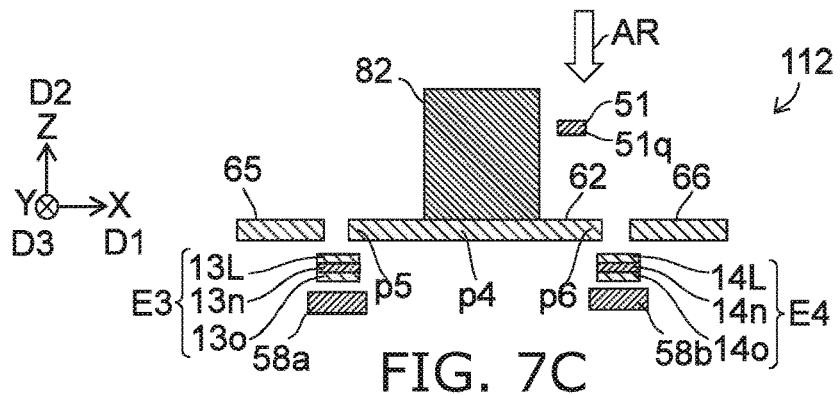

FIGS. 7A to 7C are schematic views illustrating a magnetic sensor according to the first embodiment. FIG. 7A is a plan view as viewed along arrow AR of FIGS. 7B and 7C. FIG. 7B is a line A1-A2 cross-sectional view of FIG. 7A. FIG. 7C is a line A3-A4 cross-sectional view of FIG. 7A.

As shown in FIGS. 7A to 7C, the magnetic sensor 112 according to the embodiment includes a first conductive member 58a, a second conductive member 58b, and a first current supply circuit 72a in addition to the first to sixth magnetic parts 61 to 66, the first magnetic member 81, the second magnetic member 82, and the first to fourth elements E1 to E4. Otherwise, the configuration of the magnetic sensor 112 may be similar to that of the magnetic sensor 110 (or the magnetic sensor 111).

For example, a portion of the first conductive member 58a overlaps the first element E1 in the second direction D2. Another portion of the first conductive member 58a overlaps the third element E3 in the second direction D2. A portion of the second conductive member 58b overlaps the second element E2 in the second direction D2. Another portion of the second conductive member 58b overlaps the fourth element E4 in the second direction D2.

For example, the first current supply circuit 72a is configured to supply a first supplied current id1 to the first conductive member 58a and a second supplied current id2 to the second conductive member 58b. The first supplied current id1 may include a direct current component. The second supplied current id2 may include a direct current component.

For example, the magnetic fields that are generated by the first supplied current id1 and the second supplied current id2 being supplied respectively to the first and second conductive members 58a and 58b are applied to the first to fourth elements E1 to E4.

For example, there are cases where a noise magnetic field such as geomagnetism is applied from the outside, etc. In such a case, direct currents are supplied to the first and second conductive members 58a and 58b. Thereby, current magnetic fields that cancel the noise magnetic field are applied to the first to fourth elements E1 to E4, and the effects of the external magnetic field noise can be reduced.

For example, the direct currents that are supplied to the first and second conductive members 58a and 58b may be changed according to signals obtained from the first to fourth elements E1 to E4. For example, a negative feedback control may be performed. More stable highly-sensitive detection is possible thereby.

In the example as shown in FIG. 7B, the position in the second direction D2 of the first element E1 is between the position in the second direction D2 of the first conductive member 58a and the position in the second direction D2 of the first magnetic part 61. The position in the second direction D2 of the second element E2 is between the position in the second direction D2 of the second conductive member 58b and the position in the second direction D2 of the first magnetic part 61. The position in the second direction D2 of the third element E3 is between the position in the second direction D2 of the first conductive member 58a and the position in the second direction D2 of the second magnetic part 62. The position in the second direction D2 of the fourth element E4 is between the position in the second direction D2 of the second conductive member 58b and the position in the second direction D2 of the second magnetic part 62. By such a configuration, magnetic fields that are due to conductive members are effectively applied to the elements. The size of the magnetic sensor 112 is easily reduced.

Figure 8A:
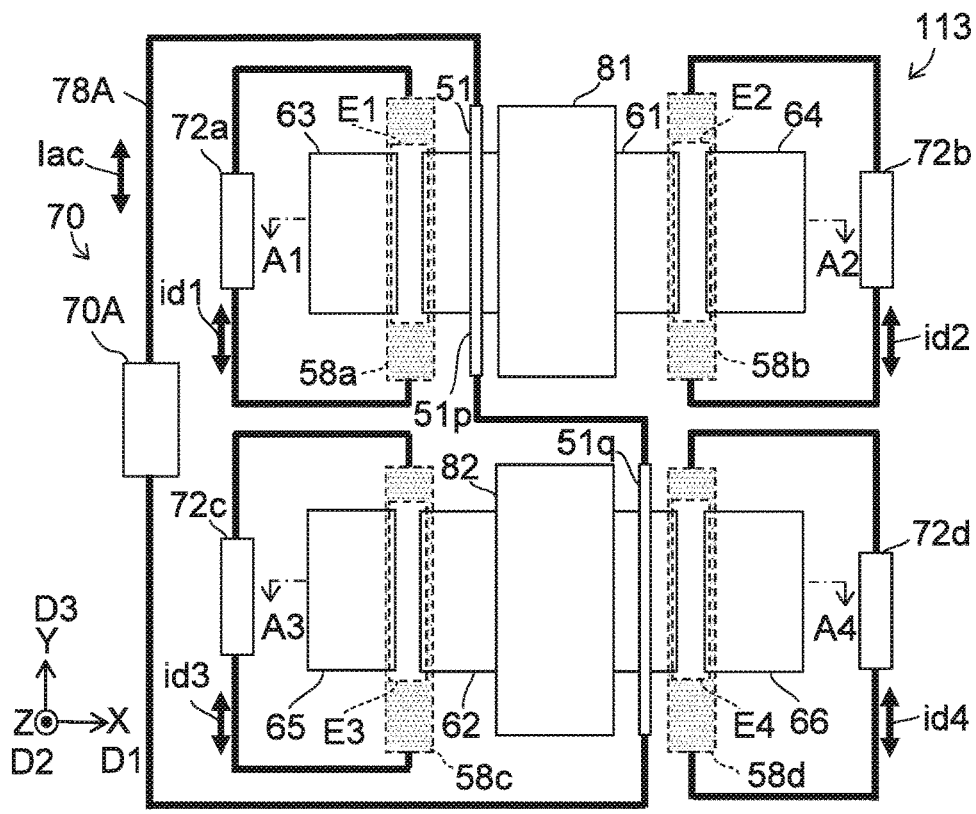
FIGS. 8A to 8C are schematic views illustrating a magnetic sensor according to the first embodiment.
Figure 8B:
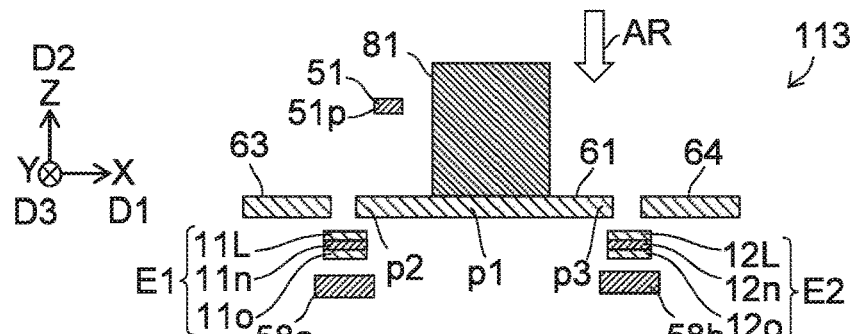
Figure 8C:
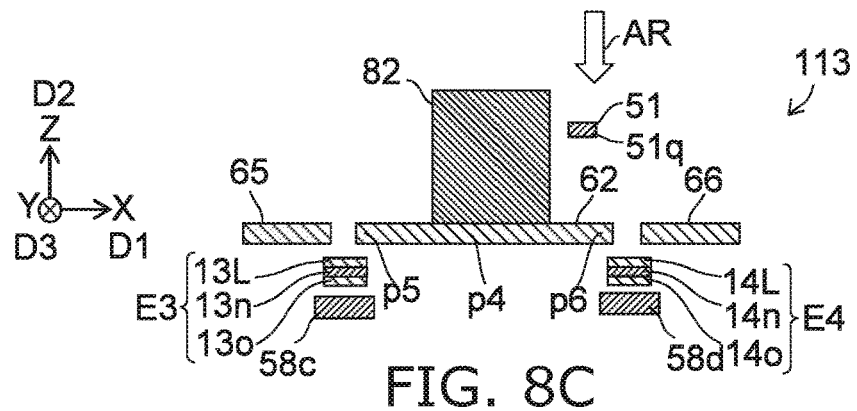

FIGS. 8A to 8C are schematic views illustrating a magnetic sensor according to the first embodiment. FIG. 8A is a plan view as viewed along arrow AR of FIGS. 8B and 8C. FIG. 8B is a line A1-A2 cross-sectional view of FIG. 8A. FIG. 8C is a line A3-A4 cross-sectional view of FIG. 8A.

As shown in FIGS. 8A to 8C, the magnetic sensor 113 according to the embodiment includes the first to fourth conductive members 58a to 58d and the first to fourth current supply circuits 72a to 72d in addition to the first to sixth magnetic parts 61 to 66, the first magnetic member 81, the second magnetic member 82, and the first to fourth elements E1 to E4. Otherwise, the configuration of the magnetic sensor 113 may be similar to that of the magnetic sensor 110 (or the magnetic sensor 111).

For example, at least a portion of the first conductive member 58a overlaps the first element E1 in the second direction D2. At least a portion of the second conductive member 58b overlaps the second element E2 in the second direction D2. At least a portion of the third conductive member 58c overlaps the third element E3 in the second direction D2. At least a portion of the fourth conductive member 58d overlaps the fourth element E4 in the second direction D2.

The first current supply circuit 72a is configured to supply the first supplied current id1 to the first conductive member 58a. The second current supply circuit 72b is configured to supply the second supplied current id2 to the second conductive member 58b. The third current supply circuit 72c is configured to supply a third supplied current id3 to the third conductive member 58c. The fourth current supply circuit 72d is configured to supply a fourth supplied current id4 to the fourth conductive member 58d. For example, the first to fourth supplied currents id1 to id4 may include direct current components.

At least two of the first supplied current id1, the second supplied current id2, the third supplied current id3, or the fourth supplied current id4 are controllable independently.

For example, there are cases where the characteristics of the first to fourth elements E1 to E4 are nonuniform and the magnitudes of the shifts from an even function are different from each other, etc. In such a case, the nonuniformity of the characteristics can be corrected by independently controlling the currents supplied to the first to fourth conductive members 58a to 58d. More stable highly-sensitive detection is possible.

For example, as shown in FIG. 8B, at least a portion of the first conductive member 58a overlaps the first element E1 in the second direction D2. For example, at least a portion of the second conductive member 58b overlaps the second element E2 in the second direction D2. As shown in FIG. 8C, for example, at least a portion of the third conductive member 58c overlaps the third element E3 in the second direction D2. For example, at least a portion of the fourth conductive member 58d overlaps the fourth element E4 in the second direction D2. An effective correction is possible by providing the first to fourth conductive members 58a to 58d respectively proximate to the corresponding elements.

For example, as shown in FIG. 8A, the position in the second direction D2 of the first element E1 is between the position in the second direction D2 of the first conductive member 58a and the position in the second direction D2 of the first magnetic part 61. The position in the second direction D2 of the second element E2 is between the position in the second direction D2 of the second conductive member 58b and the position in the second direction D2 of the first magnetic part 61. The position in the second direction D2 of the third element E3 is between the position in the second direction D2 of the third conductive member 58c and the position in the second direction D2 of the second magnetic part 62. The position in the second direction D2 of the fourth element E4 is between the position in the second direction D2 of the fourth conductive member 58d and the position in the second direction D2 of the second magnetic part 62.

The configuration (e.g., the bridge circuit) described with reference to FIG. 2 is applicable to the magnetic sensors 111 to 113.

Second Embodiment

Figure 9A:
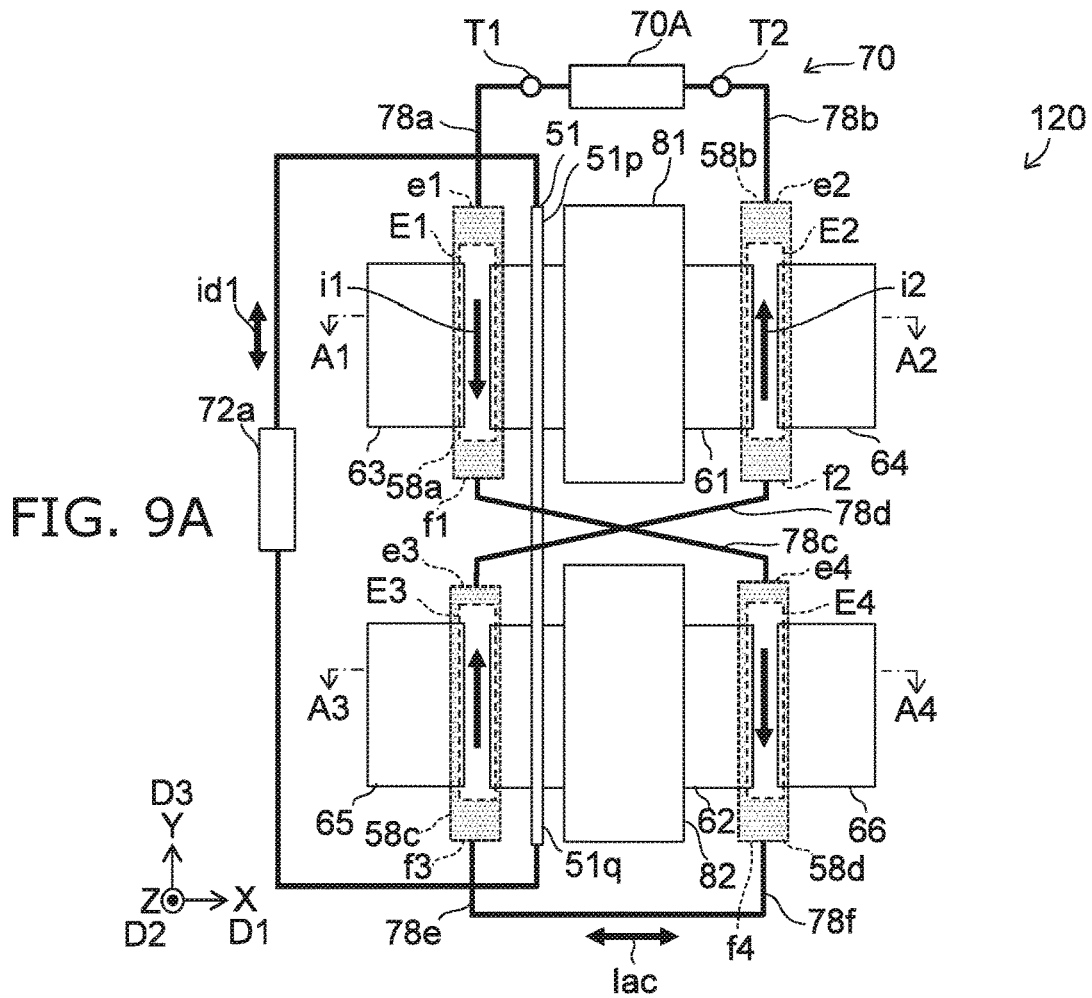
FIGS. 9A to 9C are schematic views illustrating a magnetic sensor according to a second embodiment.
Figure 9B:
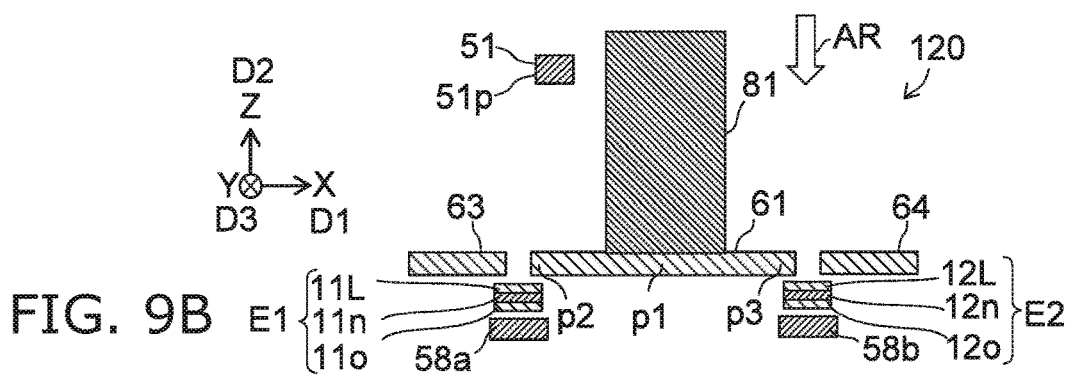
Figure 9C:
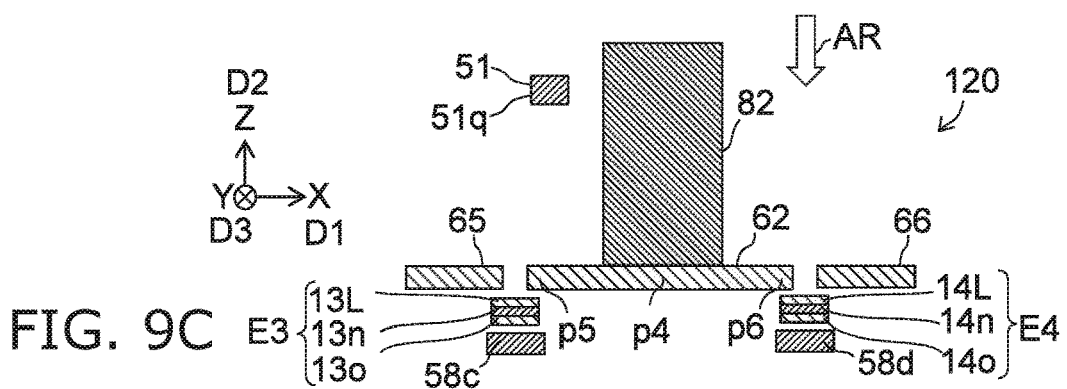

FIGS. 9A to 9C are schematic views illustrating a magnetic sensor according to a second embodiment. FIG. 9A is a plan view as viewed along arrow AR of FIGS. 9B and 9C. FIG. 9B is a line A1-A2 cross-sectional view of FIG. 9A. FIG. 9C is a line A3-A4 cross-sectional view of FIG. 9A.

As shown in FIGS. 9A to 9C, the magnetic sensor 120 according to the embodiment includes the first magnetic part 61, the first magnetic member 81, the second magnetic part 62, the second magnetic member 82, the first element E1, the second element E2, the third element E3, the fourth element E4, the first interconnect 51, the first to fourth conductive members 58a to 58d, and the alternating current circuit 70A.

The first magnetic part 61 includes the first portion p1, the second portion p2, and the third portion p3. The direction from the second portion p2 toward the third portion p3 is along the first direction D1. The first portion p1 is between the second portion p2 and the third portion p3 in the first direction D1. The second direction D2 from the first portion p1 toward the first magnetic member 81 crosses the first direction D1.

The second magnetic part 62 includes the fourth portion p4, the fifth portion p5, and the sixth portion p6. The direction from the fifth portion p5 toward the sixth portion p6 is along the first direction D1. The fourth portion p4 is between the fifth portion p5 and the sixth portion p6 in the first direction D1. The direction from the fourth portion p4 toward the second magnetic member 82 is along the second direction D2.

The first element E1 includes the first magnetic layer 11L. The first element E1 may include the first counter magnetic layer 11o and the first nonmagnetic layer 11n. The distance between the first element E1 and the second portion p2 is less than the distance between the first element E1 and the first portion p1. The second element E2 includes the second magnetic layer 12L. The second element E2 may include the second counter magnetic layer 12o and the second nonmagnetic layer 12n. The distance between the second element E2 and the third portion p3 is less than the distance between the second element E2 and the first portion p1.

The third element E3 includes the third magnetic layer 13L. The third element E3 may include the third counter magnetic layer 13o and the third nonmagnetic layer 13n. The distance between the third element E3 and the fifth portion p5 is less than the distance between the third element E3 and the fourth portion p4.

The fourth element E4 includes the fourth magnetic layer 14L. The fourth element E4 may include the fourth counter magnetic layer 14o and the fourth nonmagnetic layer 14n. The distance between the fourth element E4 and the sixth portion p6 is less than the distance between the fourth element E4 and the fourth portion p4.

The first interconnect 51 includes the first interconnect portion 51p and the second interconnect portion 51q. For example, the first interconnect portion 51p and the second interconnect portion 51q are along the third direction D3 (e.g., the Y-axis direction). The orientation from the first interconnect portion 51p toward the first magnetic member 81 includes a component in the same orientation as from the second interconnect portion 51q toward the second magnetic member 82. For example, the orientation from the first interconnect portion 51p toward the first magnetic member 81 is the +X direction, and the orientation from the second interconnect portion 51q toward the second magnetic member 82 is the +X direction.

For example, the first conductive member 58a overlaps the first element E1 in the second direction D2. For example, the second conductive member 58b overlaps the second element E2 in the second direction D2. For example, the third conductive member 58c overlaps the third element E3 in the second direction D2. For example, the fourth conductive member 58d overlaps the fourth element E4 in the second direction D2.

The first conductive member 58a includes a first end e1 and a first other end f1. The second conductive member 58b includes a second end e2 and a second other end f2. The third conductive member 58c includes a third end e3 and a third other end f3. The fourth conductive member 58d includes a fourth end e4 and a fourth other end f4. The alternating current circuit 70A includes a first terminal T1 and a second terminal T2.

As shown in FIG. 9A, the first end e1 is electrically connected to the first terminal T1. The first other end f1 is electrically connected to the fourth end e4. The second end e2 is electrically connected to the second terminal T2. The second other end f2 is electrically connected to the third end e3. The third other end f3 is electrically connected to the fourth other end f4. For example, the electrical connections described above are performed by the interconnects 78a to 78f, etc.

The alternating current circuit 70A is configured to supply the alternating current Iac to the first to fourth conductive members 58a to 58d.

In the magnetic sensor 120, the orientation of the alternating current magnetic field Hac due to the alternating current Iac flowing through the first to fourth conductive members 58a to 58d is reversed between the first element E1 and the second element E2. The orientation of the alternating current magnetic field Hac is reversed between the third element E3 and the fourth element E4. The orientation of the alternating current magnetic field Hac is the same between the first element E1 and the fourth element E4. The orientation of the alternating current magnetic field Hac is the same between the second element E2 and the third element E3. By forming a bridge circuit of such first to fourth elements E1 to E4, the effects of noise can be effectively suppressed. High sensitivity detection is possible by detecting the frequency component of the frequency of the alternating current Iac.

The magnetic sensor 120 may include the first current supply circuit 72a. The first current supply circuit 72a is configured to supply the first supplied current id1 to the first interconnect 51. The current magnetic field that is generated by the first supplied current id1 is applied to the first magnetic member 81 and the second magnetic member 82. The orientation of the current magnetic field is the same between the first magnetic member 81 and the second magnetic member 82. The characteristics of the elements can be corrected by controlling the first supplied current id1. Stable and high sensitivity is easily obtained. The first supplied current id1 may include a direct current component. The first current supply circuit 72a may be configured to perform the negative feedback control described above.

FIGS. 10A to 10D are schematic perspective views illustrating portions of the magnetic sensor according to the embodiment.

Figure 10A:
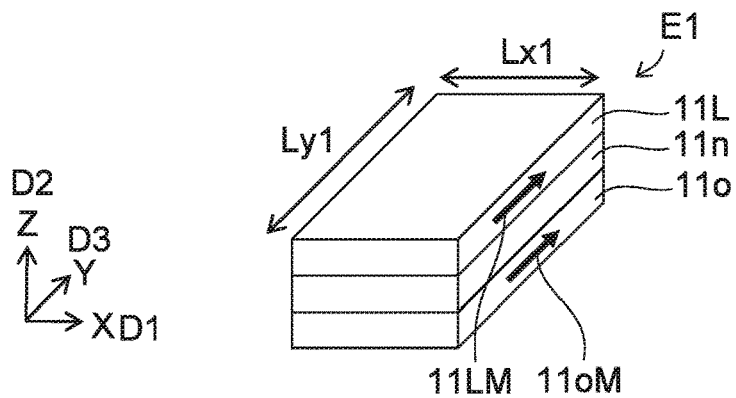
FIGS. 10A to 10D are schematic perspective views illustrating portions of the magnetic sensor according to the embodiment.
Figure 10B:
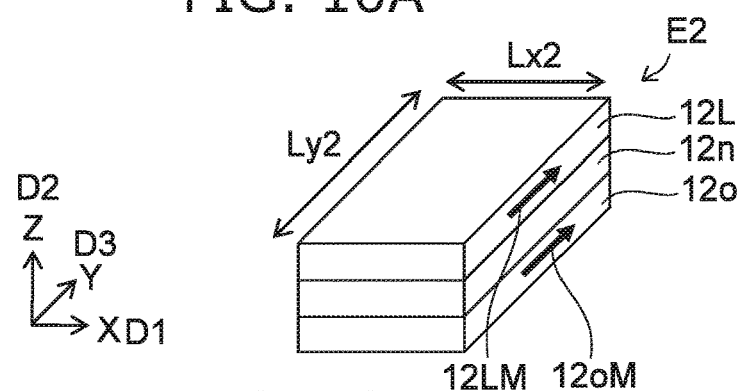
Figure 10C:
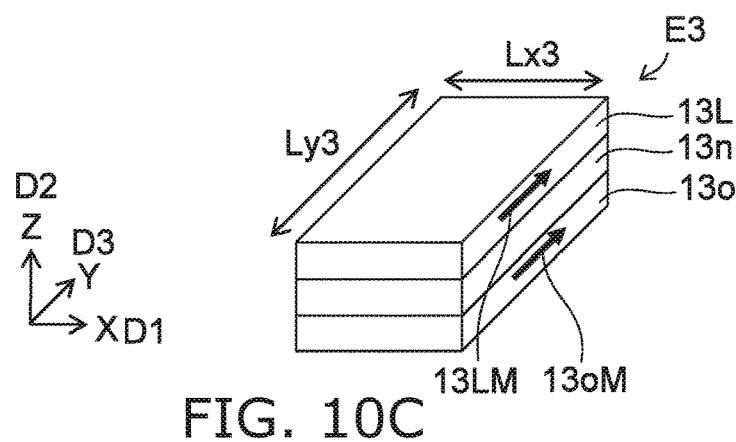

As shown in FIG. 10A, it is favorable for a length Lx1 along the first direction D1 of the first element E1 to be less than a length Ly1 along the third direction D3 of the first element E1. As shown in FIG. 10B, it is favorable for a length Lx2 along the first direction D1 of the second element E2 to be less than a length Ly2 along the third direction D3 of the second element E2. As shown in FIG. 10C, it is favorable for a length Lx3 along the first direction D1 of the third element E3 to be less than a length Ly3 along the third direction D3 of the third element E3. It is favorable for a length Lx4 along the first direction D1 of the fourth element E4 to be less than a length Ly4 along the third direction D3 of the fourth element E4.

For example, magnetic anisotropy is generated by such length relationships. Thereby, the orientations of the magnetizations of the elements are easily aligned with the third direction D3.

For example, when a magnetic field is substantially not applied, it is favorable for magnetizations 11LM to 14LM and magnetizations 11oM to 14oM to be along the third direction D3. Even-function characteristics are easily obtained thereby.

For example, the electrical resistance of the first element E1 has a substantially even-function characteristic with respect to the magnetic field applied to the first element E1. For example, the electrical resistance of the second element E2 has a substantially even-function characteristic with respect to the magnetic field applied to the second element E2. For example, the electrical resistance of the third element E3 has a substantially even-function characteristic with respect to the magnetic field applied to the third element E3. For example, the electrical resistance of the fourth element E4 has a substantially even-function characteristic with respect to the magnetic field applied to the fourth element E4.

Figure 10D:
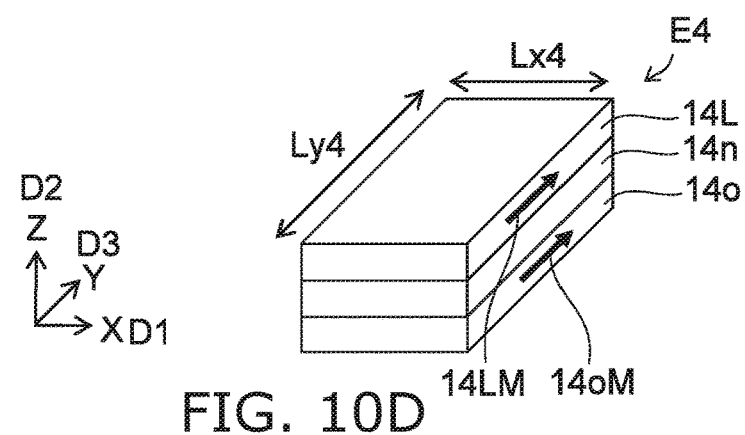

As shown in FIG. 10A, for example, the direction from the first counter magnetic layer 110 toward the first magnetic layer 11L is along the second direction D2. As shown in FIG. 10B, for example, the direction from the second counter magnetic layer 12o toward the second magnetic layer 12L is along the second direction D2. As shown in FIG. 10C, for example, the direction from the third counter magnetic layer 13o toward the third magnetic layer 13L is along the second direction D2. As shown in FIG. 10D, for example, the direction from the fourth counter magnetic layer 14o toward the fourth magnetic layer 14L is along the second direction D2.

In the embodiment, at least one of the first to fourth magnetic layers 11L to 14L, the first to fourth counter magnetic layers 11o to 14o, or the first to sixth magnetic parts 61 to 66 includes, for example, at least one selected from the group consisting of Fe, Co, and Ni. The first to fourth nonmagnetic layers 11n to 14n include, for example, Cu, etc.

An example of an application of the magnetic sensor according to the embodiment will now be described.

Figure 11:
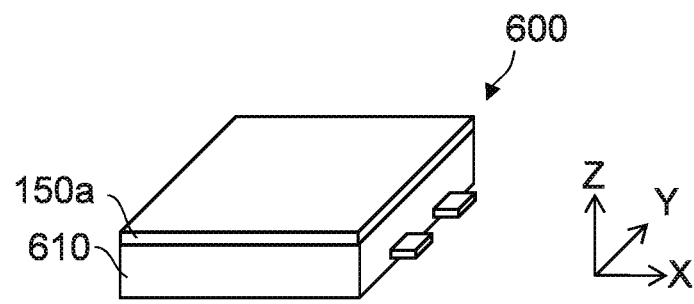
FIG. 11 is a schematic perspective view showing an application example of the magnetic sensor according to the embodiment.

FIG. 11 is a schematic perspective view showing an application example of the magnetic sensor according to the embodiment.

Figure 12:
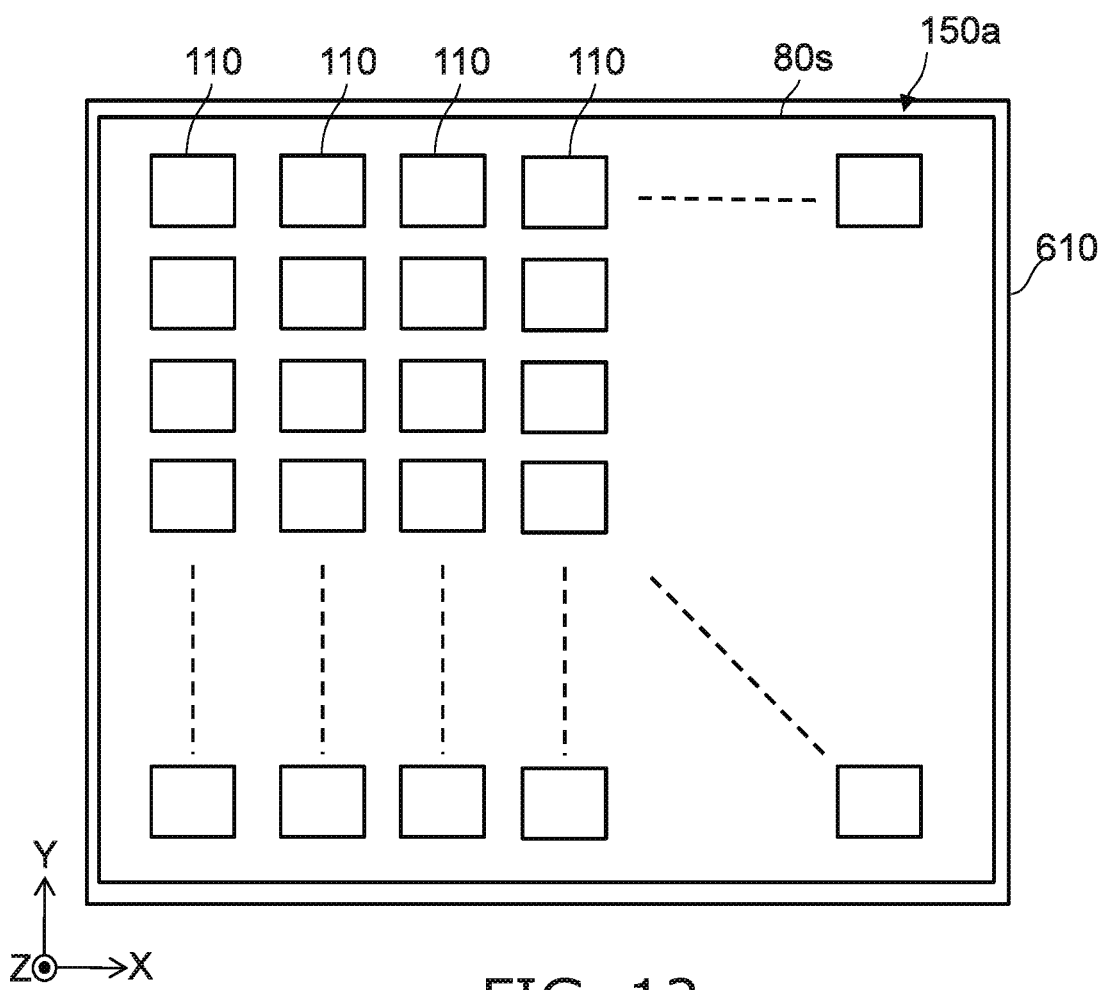
FIG. 12 is a schematic plan view showing the application example of the magnetic sensor according to the embodiment.

FIG. 12 is a schematic plan view showing the application example of the magnetic sensor according to the embodiment.

As shown in FIGS. 11 and 12, the magnetic sensor 150a according to the embodiment may be used with a battery 610. For example, a battery system 600 includes the battery 610 and the magnetic sensor 150a. The magnetic sensor 150a can detect a magnetic field generated by a current flowing in the battery 610.

For example, as shown in FIG. 12, the magnetic sensor 150a includes multiple magnetic sensors according to the embodiment. In the example, the magnetic sensor 150a includes multiple magnetic sensors (e.g., the magnetic sensors 110, etc.). For example, the multiple magnetic sensors are arranged along two directions (e.g., the X-axis direction and the Y-axis direction). For example, the multiple magnetic sensors 110 are provided on a substrate 80s.

The magnetic sensor 150a can detect the magnetic field generated by the current flowing in the battery 610. For example, there are cases where an abnormal current flows in the battery 610 when the battery 610 approaches an abnormal state. The change of the state of the battery 610 can be known by the magnetic sensor 150a detecting the abnormal current. For example, the entire battery 610 can be inspected in a short period of time by using bidirectional sensor group drive means in a state in which the magnetic sensor 150a is placed proximate to the battery 610. The magnetic sensor 150a may be used to inspect the battery 610 in the manufacturing of the battery 610.

For example, the magnetic sensor according to the embodiment is applicable to a diagnostic device, etc. An example of a diagnostic device using the magnetic sensor according to the embodiment will now be described.

Third Embodiment

Figure 13:
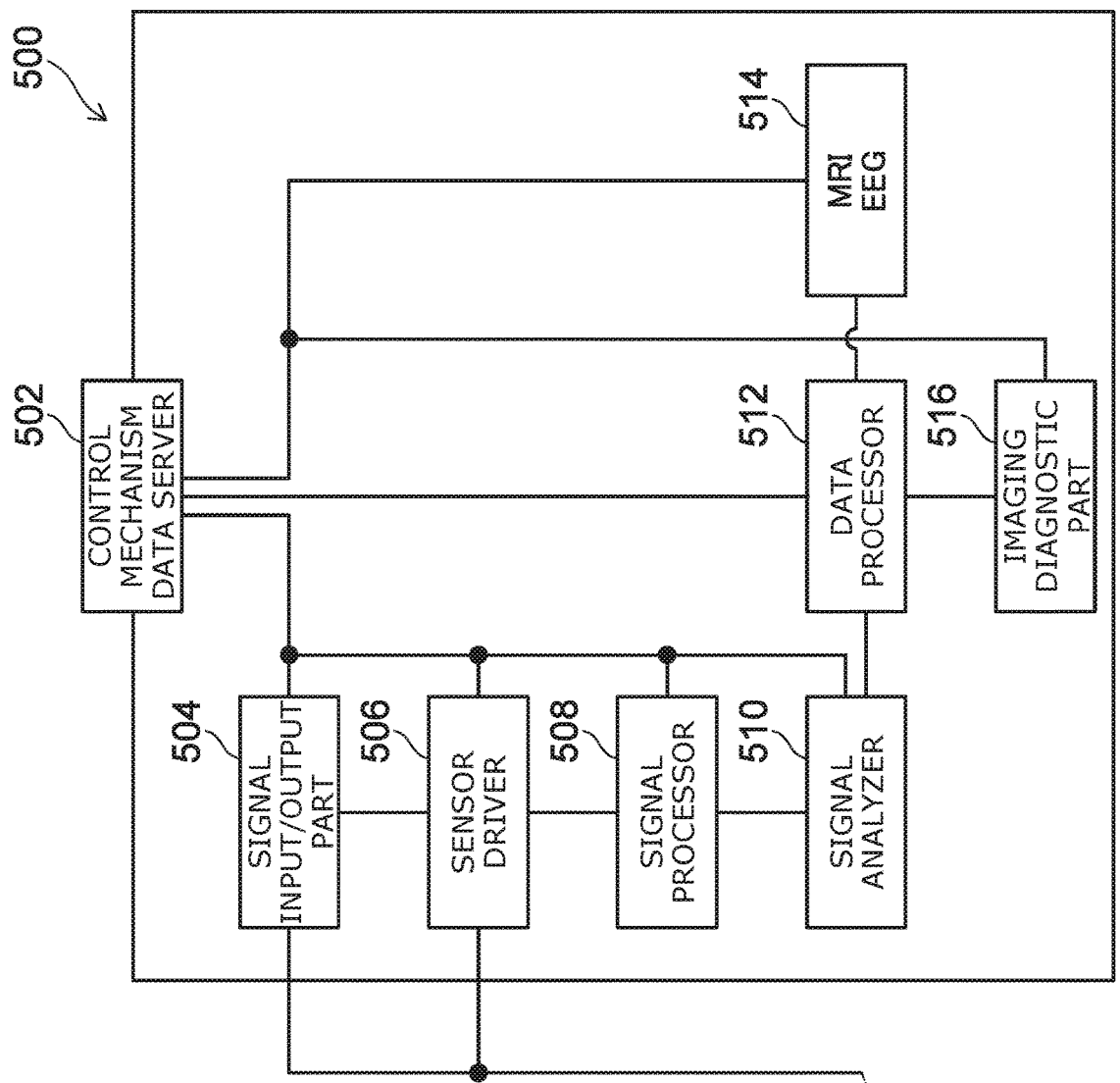
FIG. 13 is a schematic view showing a magnetic sensor and a diagnostic device according to a third embodiment.
Figure 13:
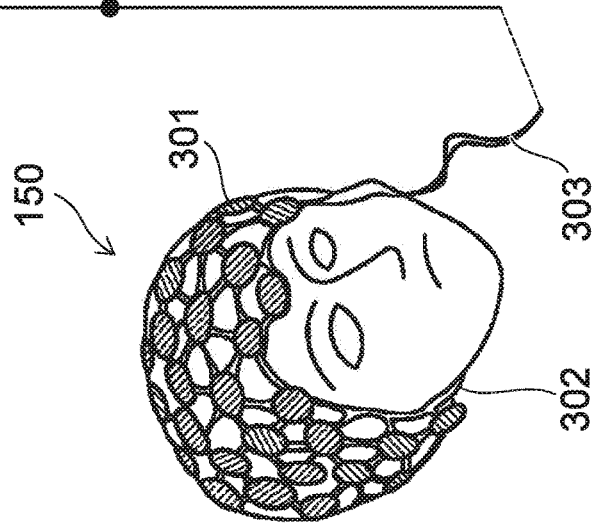

FIG. 13 is a schematic view showing a magnetic sensor and a diagnostic device according to a third embodiment.

As shown in FIG. 13, the diagnostic device 500 includes the magnetic sensor 150. The magnetic sensor 150 includes the magnetic sensors (and the magnetic sensor devices) described in reference to the first and second embodiments and modifications of these magnetic sensors (and magnetic sensor devices).

In the diagnostic device 500, the magnetic sensor 150 is, for example, a magnetoencephalograph device. The magnetoencephalograph device detects a magnetic field generated by cranial nerves. When the magnetic sensor 150 is included in a magnetoencephalograph device, the size of the magnetic element included in the magnetic sensor 150 is, for example, not less than 1 mm but less than 10 mm. The size is, for example, the length including the MFC.

As shown in FIG. 13, the magnetic sensor 150 (the magnetoencephalograph device) is mounted to, for example, the head of a human body. The magnetic sensor 150 (the magnetoencephalograph device) includes a sensor part 301 (a first sensor part SU1 or the like). The magnetic sensor 150 (the magnetoencephalograph device) may include multiple sensor parts 301 (the first sensor part SU1, a second sensor part SU2, etc.). The number of the multiple sensor parts 301 is, for example, about 100 (e.g., not less than 50 and not more than 150). The multiple sensor parts 301 are provided in a base body 302 that is pliable.

The magnetic sensor 150 may include, for example, a circuit for differential detection, etc. The magnetic sensor 150 may include a sensor other than a magnetic sensor (e.g., a potential terminal, an acceleration sensor, etc.).

The size of the magnetic sensor 150 (the magnetic sensors described in reference to the first and second embodiments) is small compared to the size of a conventional SQUID magnetic sensor. Therefore, the mounting of the multiple sensor parts 301 is easy. The mounting of the multiple sensor parts 301 and the other circuits is easy. It is easy for the multiple sensor parts 301 and the other sensors to coexist.

The base body 302 may include, for example, an elastic body such as a silicone resin, etc. For example, the multiple sensor parts 301 are linked to each other and provided in the base body 302. For example, the base body 302 can be closely adhered to the head.

An input/output cord 303 of the sensor part 301 is connected to a sensor driver 506 and a signal input/output part 504 of the diagnostic device 500. Magnetic field measurement is performed in the sensor part 301 based on the electrical power from the sensor driver 506 and the control signal from the signal input/output part 504. The result is input to the signal input/output part 504. The signal that is obtained by the signal input/output part 504 is supplied to a signal processor 508. Processing such as, for example, the removal of noise, filtering, amplification, signal calculation, etc., are performed in the signal processor 508. The signal that is processed by the signal processor 508 is supplied to a signal analyzer 510. For example, the signal analyzer 510 extracts a designated signal for magnetoencephalography. For example, signal analysis to match the signal phases is performed in the signal analyzer 510.

The output of the signal analyzer 510 (the data for which the signal analysis has ended) is supplied to a data processor 512. Data analysis is performed in the data processor 512. It is possible to include image data such as, for example, MRI (Magnetic Resonance Imaging), etc., in the data analysis. It is possible to include, for example, scalp potential information such as an EEG (Electroencephalogram), etc., in the data analysis. For example, nerve firing point analysis, inverse analysis, or the like is performed by the data analysis.

For example, the result of the data analysis is supplied to an imaging diagnostic part 516. Imaging is performed by the imaging diagnostic part 516. The diagnosis is supported by the imaging.

For example, the series of operations described above is controlled by a control mechanism 502. For example, necessary data such as preliminary signal data, metadata partway through the data processing, or the like is stored in a data server. The data server and the control mechanism may be integrated.

The diagnostic device 500 according to the embodiment includes the magnetic sensor 150, and a processor that processes the output signal obtained from the magnetic sensor 150. The processor includes, for example, at least one of the signal processor 508 or the data processor 512. The processor includes, for example, a computer, etc.

In the magnetic sensor 150 shown in FIG. 13, the sensor part 301 is mounted to the head of a human body. The sensor part 301 may be mounted to the chest of the human body. Magnetocardiography is possible thereby. For example, the sensor part 301 may be mounted to the abdomen of a pregnant woman. Palmoscopy of the fetus can be performed thereby.

It is favorable for the magnetic sensor device including the participant to be mounted inside a shielded room. For example, the effects of geomagnetism or magnetic noise can be suppressed thereby.

For example, a mechanism may be provided to locally shield the sensor part 301 or the measurement section of the human body. For example, a shield mechanism may be provided in the sensor part 301. For example, the signal analysis or the data processing may be effectively shielded.

In the embodiment, the base body 302 may be pliable or substantially may not be pliable. In the example shown in FIG. 13, the base body 302 is a continuous film that is patterned into a hat-like configuration. The base body 302 may have a net configuration. For example, good wearability is obtained thereby. For example, the adhesion of the base body 302 with the human body improves. The base body 302 may have a hard helmet-like configuration.

Figure 14:
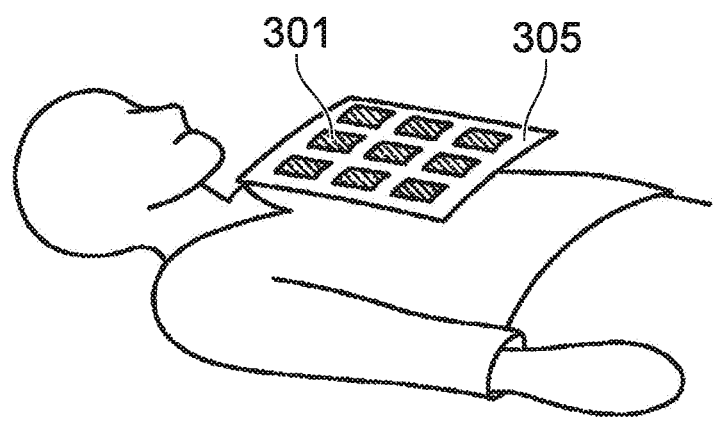
FIG. 14 is a schematic view showing the magnetic sensor according to the third embodiment.

FIG. 14 is a schematic view showing the magnetic sensor according to the third embodiment.

FIG. 14 is an example of a magnetic detection instrument. In the example shown in FIG. 14, the sensor part 301 is provided on a hard base body 305 having a flat plate configuration.

The input and output of the signal obtained from the sensor part 301 in the example shown in FIG. 14 is similar to the input and output described with reference to FIG. 13. The processing of the signal obtained from the sensor part 301 in the example shown in FIG. 14 is similar to the processing described with reference to FIG. 13.

There is a reference example in which a SQUID (Superconducting Quantum Interference Device) magnetic sensor is used as a device to measure a faint magnetic field such as a magnetic field generated from a living body, etc. Because superconductivity is used in the reference example, the device is large, and the power consumption is large. The burden on the measurement object (the patient) is large.

According to the embodiment, the device can be small. The power consumption can be suppressed. The burden on the measurement object (the patient) can be reduced. According to the embodiment, the SN ratio of the magnetic field detection can be improved. The sensitivity can be increased.

The embodiments include the following configurations (e.g., technological proposals).

Configuration 1

A magnetic sensor, comprising:
  a first magnetic part including a first portion, a second portion, and a third portion, a direction from the second portion toward the third portion being along a first direction, the first portion being between the second portion and the third portion in the first direction;
  a first magnetic member, a second direction from the first portion toward the first magnetic member crossing the first direction;
  a second magnetic part including a fourth portion, a fifth portion, and a sixth portion, a direction from the fifth portion toward the sixth portion being along the first direction, the fourth portion being between the fifth portion and the sixth portion in the first direction;
  a second magnetic member, a direction from the fourth portion toward the second magnetic member being along the second direction;
  a first element including a first magnetic layer, a distance between the first element and the second portion being less than a distance between the first element and the first portion;
  a second element including a second magnetic layer, a distance between the second element and the third portion being less than a distance between the second element and the first portion;
  a third element including a third magnetic layer, a distance between the third element and the fifth portion being less than a distance between the third element and the fourth portion;
  a fourth element including a fourth magnetic layer, a distance between the fourth element and the sixth portion being less than a distance between the fourth element and the fourth portion; and
  a first interconnect including a first interconnect portion and a second interconnect portion, an orientation from the first interconnect portion toward the first magnetic member including a reverse component of an orientation from the second interconnect portion toward the second magnetic member.

Configuration 2

The magnetic sensor according to Configuration 1, further comprising:
  a first conductive member;
  a second conductive member; and
  a first current supply circuit,
  a portion of the first conductive member overlapping the first element in the second direction,
  an other portion of the first conductive member overlapping the third element in the second direction,
  a portion of the second conductive member overlapping the second element in the second direction,
  an other portion of the second conductive member overlapping the fourth element in the second direction,
  the first current circuit being configured to supply at least one of a first supplied current to the first conductive member or a second supplied current to the second conductive member.

Configuration 3

The magnetic sensor according to Configuration 2, wherein
  a position in the second direction of the first element is between a position in the second direction of the first conductive member and a position in the second direction of the first magnetic part.

Configuration 4

The magnetic sensor according to Configuration 1, further comprising:
- a first conductive member;
- a second conductive member;
- a third conductive member;
- a fourth conductive member;
- a first current supply circuit configured to supply a first supplied current to the first conductive member;
- a second current supply circuit configured to supply a second supplied current to the second conductive member;
- a third current supply circuit configured to supply a third supplied current to the third conductive member; and
- a fourth current supply circuit configured to supply a fourth supplied current to the fourth conductive member, at least two of the first supplied current, the second supplied current, the third supplied current, or the fourth supplied current being independently controllable.

Configuration 5

The magnetic sensor according to Configuration 4, wherein
- at least a portion of the first conductive member overlaps the first element in the second direction,
- at least a portion of the second conductive member overlaps the second element in the second direction,
- at least a portion of the third conductive member overlaps the third element in the second direction, and
- at least a portion of the fourth conductive member overlaps the fourth element in the second direction.

Configuration 6

The magnetic sensor according to Configuration 4 or 5, wherein
- a position in the second direction of the first element is between a position in the second direction of the first conductive member and a position in the second direction of the first magnetic part.

Configuration 7

The magnetic sensor according to any one of Configurations 1 to 6, further comprising:
- an alternating current circuit configured to supply an alternating current to the first interconnect.

Configuration 8

A magnetic sensor, comprising:
- a first magnetic part including a first portion, a second portion, and a third portion, a direction from the second portion toward the third portion being along a first direction, the first portion being between the second portion and the third portion in the first direction;
- a first magnetic member, a second direction from the first portion toward the first magnetic member crossing the first direction;
- a second magnetic part including a fourth portion, a fifth portion, and a sixth portion, a direction from the fifth portion toward the sixth portion being along the first direction, the fourth portion being between the fifth portion and the sixth portion in the first direction;
- a second magnetic member, a direction from the fourth portion toward the second magnetic member being along the second direction;
- a first element including a first magnetic layer, a distance between the first element and the second portion being less than a distance between the first element and the first portion;
- a second element including a second magnetic layer, a distance between the second element and the third portion being less than a distance between the second element and the first portion;
- a third element including a third magnetic layer, a distance between the third element and the fifth portion being less than a distance between the third element and the fourth portion;
- a fourth element including a fourth magnetic layer, a distance between the fourth element and the sixth portion being less than a distance between the fourth element and the fourth portion;
- a first interconnect including a first interconnect portion and a second interconnect portion, an orientation from the first interconnect portion toward the first magnetic member including a component in a same orientation as an orientation from the second interconnect portion toward the second magnetic member;
- a first conductive member overlapping the first element;
- a second conductive member overlapping the second element;
- a third conductive member overlapping the third element;
- a fourth conductive member overlapping the fourth element; and
- an alternating current circuit including a first terminal and a second terminal,
- a first end of the first conductive member being electrically connected to the first terminal,
- a first other end of the first conductive member being electrically connected to a fourth end of the fourth conductive member,
- a second end of the second conductive member being electrically connected to the second terminal,
- a second other end of the second conductive member being electrically connected to a third end of the third conductive member,
- a third other end of the third conductive member being electrically connected to a fourth other end of the fourth conductive member,
- the alternating current circuit being configured to supply an alternating current to the first to fourth conductive members.

Configuration 9

The magnetic sensor according to Configuration 8, further comprising:
- a first current supply circuit,
- the first current supply circuit being configured to supply a first supplied current to the first interconnect.

Configuration 10

The magnetic sensor according to any one of Configurations 1 to 9, further comprising:
- a first connector electrically connecting the first element and the fourth element; and
- a second connector electrically connecting the second element and the third element.

Configuration 11

The magnetic sensor according to Configuration 10, further comprising:
- a first circuit,
- the first circuit being configured to supply a first current to a first path, the first path including the first element, the first connector, and the fourth element,
- the first circuit being configured to supply a second current to a second path, the second path including the second element, the second connector, and the third element,
- an orientation of the first current in the first element including a reverse component of an orientation of the second current in the second element.

Configuration 12

The magnetic sensor according to Configuration 11, further comprising:
a detection circuit configured to detect a signal generated between the first connector and the second connector.

Configuration 13

The magnetic sensor according to Configuration 12, wherein
the detection circuit is configured to detect an intensity of a frequency component of ½ of a frequency of the alternating current included in the signal.

Configuration 14

The magnetic sensor according to any one of Configurations 1 to 13, further comprising:
a third magnetic part;
a fourth magnetic part;
a fifth magnetic part; and
a sixth magnetic part,
the first magnetic part being between the third magnetic part and the fourth magnetic part in the first direction,
the second magnetic part being between the fifth magnetic part and the sixth magnetic part in the first direction,
a direction from the first element toward a region between the third magnetic part and the first magnetic part being along the second direction,
a direction from the second element toward a region between the first magnetic part and the fourth magnetic part being along the second direction,
a direction from the third element toward a region between the fifth magnetic part and the second magnetic part being along the second direction,
a direction from the fourth element toward a region between the second magnetic part and the sixth magnetic part being along the second direction.

Configuration 15

The magnetic sensor according to any one of Configurations 1 to 11, further comprising:
a third magnetic part;
a fourth magnetic part;
a fifth magnetic part; and
a sixth magnetic part,
the first magnetic part being between the third magnetic part and the fourth magnetic part in the first direction,
the second magnetic part being between the fifth magnetic part and the sixth magnetic part in the first direction,
at least a portion of the first element being between the third magnetic part and the first magnetic part in the first direction,
at least a portion of the second element being between the first magnetic part and the fourth magnetic part in the first direction,
at least a portion of the third element being between the fifth magnetic part and the second magnetic part in the first direction,
at least a portion of the fourth element being between the second magnetic part and the sixth magnetic part in the first direction.

Configuration 16

The magnetic sensor according to any one of Configurations 1 to 15, wherein
a length along the first direction of the first element is less than a length along the third direction of the first element,
a length along the first direction of the second element is less than a length along the third direction of the second element,
a length along the first direction of the third element is less than a length along the third direction of the third element, and
a length along the first direction of the fourth element is less than a length along the third direction of the fourth element.

Configuration 17

The magnetic sensor according to any one of Configurations 1 to 16, wherein
the first element includes a first counter magnetic layer and a first nonmagnetic layer,
the first nonmagnetic layer is between the first counter magnetic layer and the first magnetic layer,
the second element includes a second counter magnetic layer and a second nonmagnetic layer,
the second nonmagnetic layer is between the second counter magnetic layer and the second magnetic layer,
the third element includes a third counter magnetic layer and a third nonmagnetic layer,
the third nonmagnetic layer is between the third counter magnetic layer and the third magnetic layer,
the fourth element includes a fourth counter magnetic layer and a fourth nonmagnetic layer, and
the fourth nonmagnetic layer is between the fourth counter magnetic layer and the fourth magnetic layer.

Configuration 18

The magnetic sensor according to Configuration 17, wherein
at least one of a magnetization of the first magnetic layer or a magnetization of the first counter magnetic layer is along the third direction.

Configuration 19

The magnetic sensor according to Configuration 17 or 18, wherein
a direction from the first counter magnetic layer toward the first magnetic layer is along the second direction,
a direction from the second counter magnetic layer toward the second magnetic layer is along the second direction,
a direction from the third counter magnetic layer toward the third magnetic layer is along the second direction, and
a direction from the fourth counter magnetic layer toward the fourth magnetic layer is along the second direction.

Configuration 20

A diagnostic device, comprising:
the magnetic sensor according to any one of Configurations 1 to 19; and
a processor processing an output signal obtained from the magnetic sensor.

According to the embodiments, a magnetic sensor and a diagnostic device can be provided in which the sensitivity can be increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic sensors such as elements, magnetic layers, nonmagnetic parts, interconnects, resistance parts, circuit parts, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic sensors, and diagnostic devices practicable by an appropriate design modification by one skilled in the art based on the magnetic sensors, and the diagnostic devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic sensor, comprising:
   a first magnetic part including a first portion, a second portion, and a third portion, a direction from the second portion toward the third portion being along a first direction, the first portion being between the second portion and the third portion in the first direction;
   a first magnetic member, a second direction from the first portion toward the first magnetic member crossing the first direction;
   a second magnetic part including a fourth portion, a fifth portion, and a sixth portion, a direction from the fifth portion toward the sixth portion being along the first direction, the fourth portion being between the fifth portion and the sixth portion in the first direction;
   a second magnetic member, a direction from the fourth portion toward the second magnetic member being along the second direction;
   a first element including a first magnetic layer, a distance between the first element and the second portion being less than a distance between the first element and the first portion;
   a second element including a second magnetic layer, a distance between the second element and the third portion being less than a distance between the second element and the first portion;
   a third element including a third magnetic layer, a distance between the third element and the fifth portion being less than a distance between the third element and the fourth portion;
   a fourth element including a fourth magnetic layer, a distance between the fourth element and the sixth portion being less than a distance between the fourth element and the fourth portion; and
   a first interconnect including a first interconnect portion and a second interconnect portion, an orientation from the first interconnect portion toward the first magnetic member including a reverse component of an orientation from the second interconnect portion toward the second magnetic member.

2. The magnetic sensor according to claim 1, further comprising:
   a first conductive member;
   a second conductive member; and
   a first current supply circuit,
   a portion of the first conductive member overlapping the first element in the second direction,
   an other portion of the first conductive member overlapping the third element in the second direction,
   a portion of the second conductive member overlapping the second element in the second direction,
   an other portion of the second conductive member overlapping the fourth element in the second direction,
   the first current circuit being configured to supply at least one of a first supplied current to the first conductive member or a second supplied current to the second conductive member.

3. The magnetic sensor according to claim 2, wherein
   a position in the second direction of the first element is between a position in the second direction of the first conductive member and a position in the second direction of the first magnetic part.

4. The magnetic sensor according to claim 1, further comprising:
   a first conductive member;
   a second conductive member;
   a third conductive member;
   a fourth conductive member;
   a first current supply circuit configured to supply a first supplied current to the first conductive member;
   a second current supply circuit configured to supply a second supplied current to the second conductive member;
   a third current supply circuit configured to supply a third supplied current to the third conductive member; and
   a fourth current supply circuit configured to supply a fourth supplied current to the fourth conductive member,
   at least two of the first supplied current, the second supplied current, the third supplied current, or the fourth supplied current being independently controllable.

5. The magnetic sensor according to claim 4, wherein
   at least a portion of the first conductive member overlaps the first element in the second direction,
   at least a portion of the second conductive member overlaps the second element in the second direction,
   at least a portion of the third conductive member overlaps the third element in the second direction, and
   at least a portion of the fourth conductive member overlaps the fourth element in the second direction.

6. The magnetic sensor according to claim 4, wherein
   a position in the second direction of the first element is between a position in the second direction of the first conductive member and a position in the second direction of the first magnetic part.

7. The magnetic sensor according to claim 1, further comprising:
   an alternating current circuit configured to supply an alternating current to the first interconnect.

8. The magnetic sensor according to claim 1, further comprising:
   a first connector electrically connecting the first element and the fourth element; and a second connector electrically connecting the second element and the third element.

9. The magnetic sensor according to claim 8, further comprising:
a first circuit,
the first circuit being configured to supply a first current to a first path, the first path including the first element, the first connector, and the fourth element,
the first circuit being configured to supply a second current to a second path, the second path including the second element, the second connector, and the third element,
an orientation of the first current in the first element including a reverse component of an orientation of the second current in the second element.

10. The magnetic sensor according to claim 9, further comprising:
a detection circuit configured to detect a signal generated between the first connector and the second connector.

11. The magnetic sensor according to claim 10, wherein the detection circuit is configured to detect an intensity of a frequency component of ½ of a frequency of the alternating current included in the signal.

12. The magnetic sensor according to claim 1, further comprising:
a third magnetic part;
a fourth magnetic part;
a fifth magnetic part; and
a sixth magnetic part,
the first magnetic part being between the third magnetic part and the fourth magnetic part in the first direction,
the second magnetic part being between the fifth magnetic part and the sixth magnetic part in the first direction,
a direction from the first element toward a region between the third magnetic part and the first magnetic part being along the second direction,
a direction from the second element toward a region between the first magnetic part and the fourth magnetic part being along the second direction,
a direction from the third element toward a region between the fifth magnetic part and the second magnetic part being along the second direction,
a direction from the fourth element toward a region between the second magnetic part and the sixth magnetic part being along the second direction.

13. The magnetic sensor according to claim 1, further comprising:
a third magnetic part;
a fourth magnetic part;
a fifth magnetic part; and
a sixth magnetic part,
the first magnetic part being between the third magnetic part and the fourth magnetic part in the first direction,
the second magnetic part being between the fifth magnetic part and the sixth magnetic part in the first direction,
at least a portion of the first element being between the third magnetic part and the first magnetic part in the first direction,
at least a portion of the second element being between the first magnetic part and the fourth magnetic part in the first direction,
at least a portion of the third element being between the fifth magnetic part and the second magnetic part in the first direction,
at least a portion of the fourth element being between the second magnetic part and the sixth magnetic part in the first direction.

14. The magnetic sensor according to claim 1, wherein
a length along the first direction of the first element is less than a length along a third direction of the first element,
a length along the first direction of the second element is less than a length along the third direction of the second element,
a length along the first direction of the third element is less than a length along the third direction of the third element, and
a length along the first direction of the fourth element is less than a length along the third direction of the fourth element, and
the third direction crosses a plane including the first direction and the second direction.

15. The magnetic sensor according to claim 1, wherein
the first element includes a first counter magnetic layer and a first nonmagnetic layer,
the first nonmagnetic layer is between the first counter magnetic layer and the first magnetic layer,
the second element includes a second counter magnetic layer and a second nonmagnetic layer,
the second nonmagnetic layer is between the second counter magnetic layer and the second magnetic layer,
the third element includes a third counter magnetic layer and a third nonmagnetic layer,
the third nonmagnetic layer is between the third counter magnetic layer and the third magnetic layer,
the fourth element includes a fourth counter magnetic layer and a fourth nonmagnetic layer, and
the fourth nonmagnetic layer is between the fourth counter magnetic layer and the fourth magnetic layer.

16. The magnetic sensor according to claim 15, wherein at least one of a magnetization of the first magnetic layer or a magnetization of the first counter magnetic layer is along the third direction.

17. The magnetic sensor according to claim 15, wherein
a direction from the first counter magnetic layer toward the first magnetic layer is along the second direction,
a direction from the second counter magnetic layer toward the second magnetic layer is along the second direction,
a direction from the third counter magnetic layer toward the third magnetic layer is along the second direction, and
a direction from the fourth counter magnetic layer toward the fourth magnetic layer is along the second direction.

18. A diagnostic device, comprising:
the magnetic sensor according to claim 1; and
a processor processing an output signal obtained from the magnetic sensor.

* * * * *